(12) United States Patent
Cho

(10) Patent No.: US 10,741,491 B1
(45) Date of Patent: Aug. 11, 2020

(54) ELECTRONIC DEVICE AND METHOD OF FABRICATING THE SAME

(71) Applicant: SK hynix Inc., Icheon (KR)

(72) Inventor: Han Woo Cho, Yongin (KR)

(73) Assignee: SK hynix Inc., Icheon (KR)

(*) Notice: Subject to any disclaimer, the term of this patent is extended or adjusted under 35 U.S.C. 154(b) by 0 days.

(21) Appl. No.: 16/538,690

(22) Filed: Aug. 12, 2019

(30) Foreign Application Priority Data

Apr. 8, 2019 (KR) .................. 10-2019-0041000

(51) Int. Cl.
*H01L 23/522* (2006.01)
*H01L 43/02* (2006.01)
*H01L 45/00* (2006.01)
*H01L 21/768* (2006.01)

(52) U.S. Cl.
CPC .... *H01L 23/5228* (2013.01); *H01L 21/76886* (2013.01); *H01L 43/02* (2013.01); *H01L 45/12* (2013.01)

(58) Field of Classification Search
None
See application file for complete search history.

(56) References Cited

U.S. PATENT DOCUMENTS

| 8,198,618 B2* | 6/2012 | Mikawa | ............... H01L 27/101 257/2 |
| 2013/0250676 A1* | 9/2013 | Hishida | .................. G11C 16/06 365/185.2 |

FOREIGN PATENT DOCUMENTS

| KR | 20080029608 A | 4/2008 |
| KR | 101753256 B1 | 7/2017 |

* cited by examiner

*Primary Examiner* — Thien F Tran

(57) ABSTRACT

An electronic device includes a semiconductor memory comprising row lines, column lines, memory cells, and a plurality of contact plugs including row contact plugs respectively coupled to the row lines and column contact plugs respectively coupled to the column lines. Each memory cell is coupled to a row line and a column line, and has a current path comprising a portion of that row line and a portion of that column line. First and second contact plug are respectively coupled to first and second memory cells respectively having first and second current paths. A resistance of the first current path is lower than a resistance of the second current path, and a resistance of the first contact plug is increased relative to a resistance of the second contact plug to offset the lower resistance of the first current path.

20 Claims, 14 Drawing Sheets

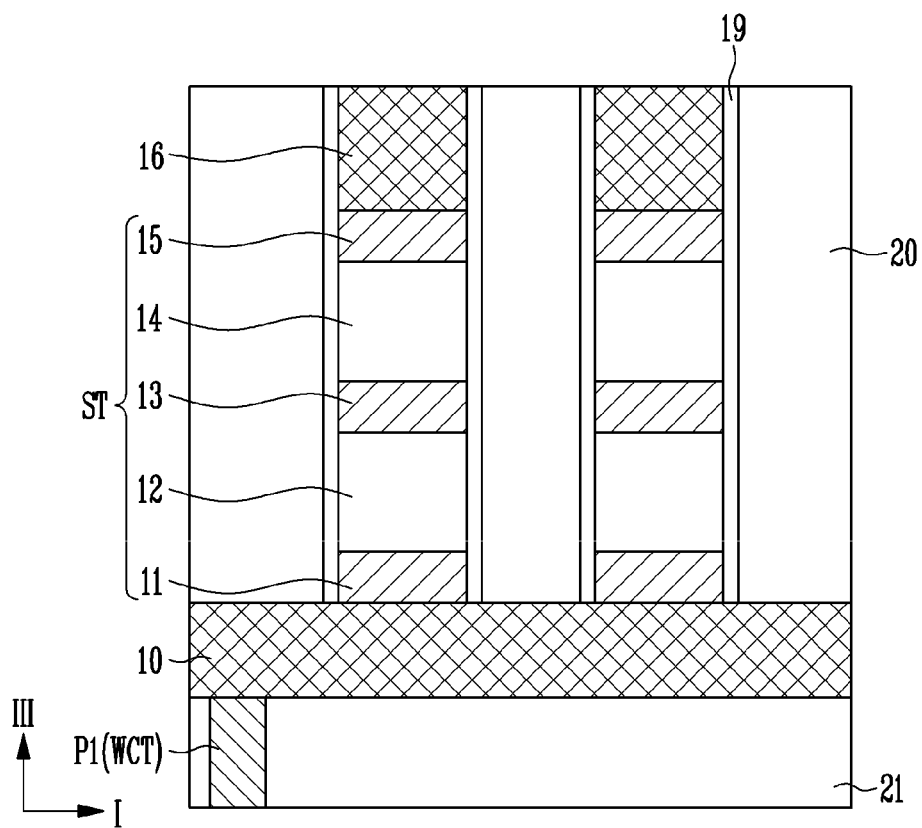

ELECTRONIC DEVICE AND METHOD OF FABRICATING THE SAME

CROSS-REFERENCE TO RELATED APPLICATION

The present application claims priority under 35 U.S.C. § 119(a) to Korean Patent Application Number 10-2019-0041000 filed on Apr. 8, 2019, the entire disclosure of which is incorporated herein by reference in its entirety.

BACKGROUND

Embodiments of the present disclosure relate to a memory circuit or device, and application thereof in an electronic device.

Semiconductor devices configured to store information are used in various electronic apparatuses such as computers and portable communication apparatuses. To satisfy the requirements for improved speed, density, and power efficiency in non-volatile storage of data, semiconductor devices have been developed that store data using materials that switch between different resistance phases depending on an applied voltage or current. Examples of such semiconductor devices include a resistive random access memory (RRAM), a phase-change random access memory (PRAM), a ferroelectric random access memory (FRAM), a magnetic random access memory (MRAM), an E-fuse, and so forth.

Such semiconductor devices store data in a plurality of memory cells. When too large a current (that is, an "over current") is applied to a memory cell of such a semiconductor device, the memory cell may be damaged.

SUMMARY

Embodiments of the present disclosure are directed to an electronic device provided with memory cells having improved operating characteristics and reliability, and a method of fabricating the electronic device.

Embodiments of the present disclosure include a method of fabricating an electronic device. The method includes forming a plurality of conductive plugs including first and second conductive plugs, the first conductive plug being associated with a first current path of a first memory cell and the second conductive plug being associated with a second current path of a second memory cell, and processing the first conductive plug to increase a resistance of the first conductive plug to a value higher than a resistance of the second conductive plug of the plurality of conductive plugs.

The conductive plugs may include row plugs and columns plugs, and the method may further comprise forming row lines and column lines respectively coupled to the row plugs and column plugs, and forming memory cells each coupled to a respective row line and a respective column line, and each having a respective current path including a portion of the respective row line and a portion of the respective column line. The first current path of the first memory cell coupled to the first conductive plug is longer than the second current path of a second memory cell coupled to the second conductive plug, or a resistance of the first current path is higher than a resistance of the second current path, or both.

An embodiment in an electronic device includes a semiconductor memory. The semiconductor memory has a plurality of lines, a plurality of contact plugs, and a plurality of memory cells. The plurality of lines includes a plurality of row lines and a plurality of column lines. The plurality of contact plugs includes a plurality of row contact plugs respectively coupled to the plurality of row lines and a plurality of column contact plugs respectively coupled to the plurality of column lines. Each memory cell has a current path coupled to a row contact plug and a column contact plug, and the current path including a portion of a column line coupled between the memory cell and the column contact plug and a portion of a row line coupled between the memory cell and the row contact plug. A first memory cell has a first current path coupled to a first contact plug, and the first current path has a first resistance. A second memory cell has a second current path coupled to a second contact plug, and the second current path has a second resistance higher than the first resistance. The first contact plug is configured to have a higher resistance than that of the second contact plug to compensate for a difference between the first and second resistances.

In an embodiment, third and fourth contact plugs are disposed in a periphery of the cell region, wherein the first current path includes a portion of a first conductive line coupled between the first memory cell and the third contact plug, and the second current path includes a portion of a second conductive line coupled between the second memory cell and the fourth contact plug. The portion of the first conductive line is shorter than and has a lower resistance than the portion of the second conductive line.

In an embodiment, a length of the portion of the first conductive line is no more than half a length of the portion of the second conductive line. In another embodiment, a length of the portion of the first conductive line is no more than one quarter of a length of the portion of the second conductive line.

BRIEF DESCRIPTION OF THE DRAWINGS

FIGS. 2A, 2B, and 2C illustrate the structure of an electronic device according to an embodiment.

DETAILED DESCRIPTION

Hereinafter, various embodiments of the present disclosure will be described in detail with reference to the accompanying drawings.

The drawings are not necessarily to scale, and in some instances, proportions may have been exaggerated in order to clearly illustrate features of the embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multi-layer structure (e.g., one or more additional layers may be present between two illustrated layers). For example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1A:
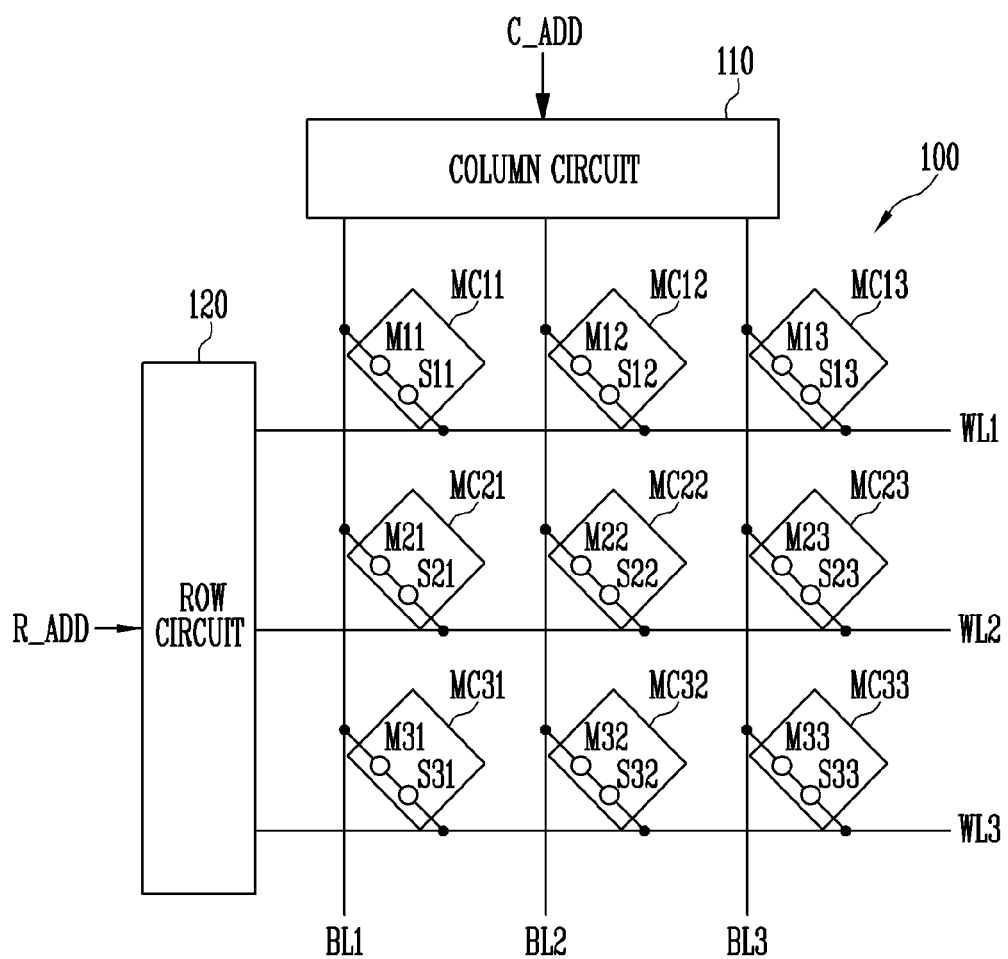
FIGS. 1A and 1B illustrate the structure of an electronic device in accordance with an embodiment.
Figure 1B:
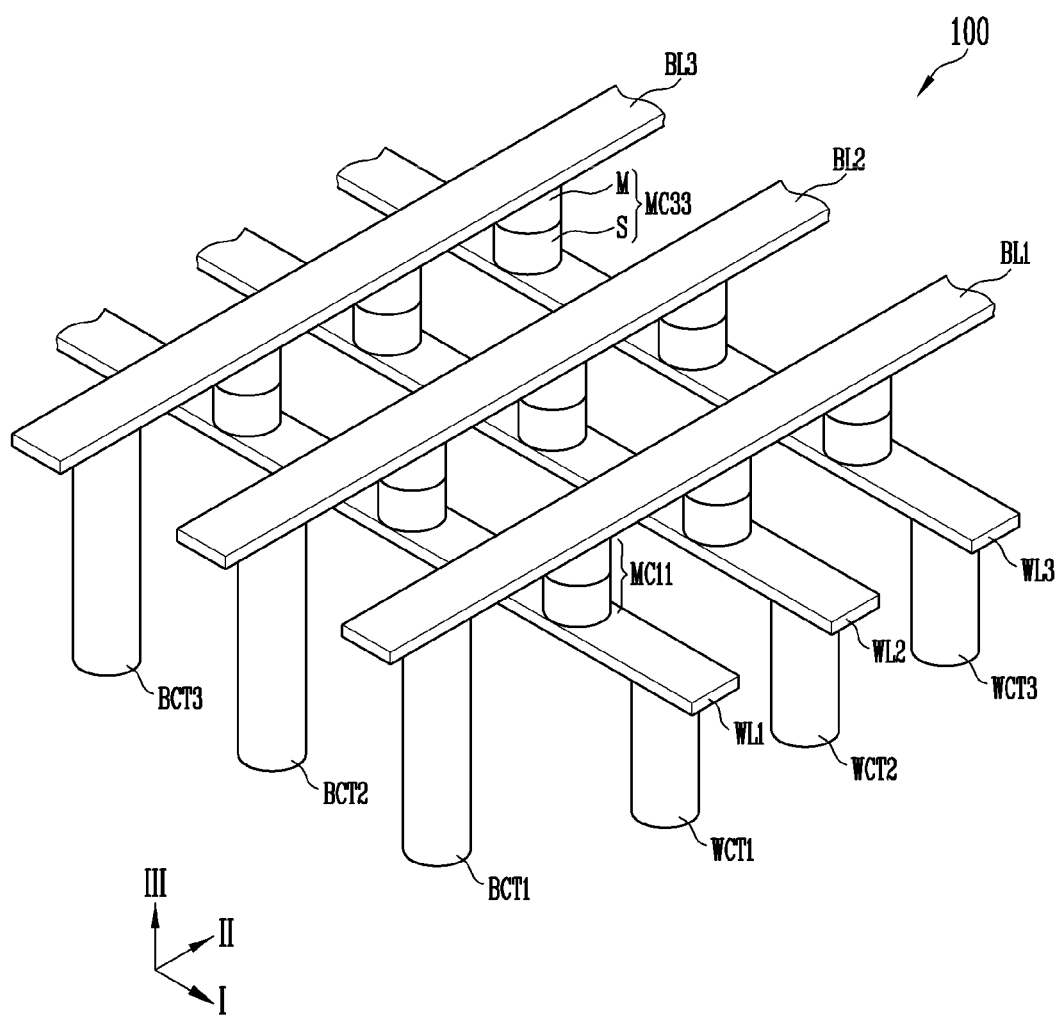

FIGS. 1A to 1B are diagrams illustrating the structure of electronic device in accordance with an embodiment of the present disclosure. FIG. 1A is a circuit diagram of a memory cell array 100, and FIG. 1B is a perspective diagram illustrating the memory cell array 100.

Referring to FIG. 1A, an electronic device in accordance with an embodiment of the present disclosure may include a semiconductor memory comprising a memory cell array 100, a column circuit 110, and a row circuit 120. The semiconductor memory may be a nonvolatile memory device or a variable resistance memory device. The semiconductor memory may include row lines and column lines that intersect the row lines. Here, the row lines may be word lines, and the column lines may be bit lines. For reference, the notions of the terms "word lines" and "bit lines" may be relative to each other. Hence, the row lines may be bit lines, and the column lines may be word lines. The following description will be made on the assumption that row lines are word lines, and column lines are bit lines.

The memory cell array 100 may include memory cells MC11 to MC33 respectively disposed between the column lines BL1 to BL3 and the row lines WL1 to WL3. Here, the memory cells MC11 to MC33 may be disposed at respective intersections between the column lines BL1 to BL3 and the row lines WL1 to WL3, with memory cell MCij disposed at the intersection of row line WLi and column line BLj for I=1 to 3, j=1 to 3. Each of the memory cells MC11 to MC33 includes a respective select element S11 to S33 and a respective memory element M11 to M33 that are coupled in series to each other. Each of the select elements S11 to S33 may be electrically coupled to one of the row lines WL1 to WL3. Each of the memory devices M11 to M33 may be electrically coupled to one of the column lines BL1 to BL3.

Each of the memory elements M11 to M33 may operate as a storage node for storing data. For example, each of the memory elements M11 to M33 may include variable resistance material such as a resistive material, a magnetic tunnel junction (MTJ), a phase change material, or combinations thereof. Each of the select elements S11 to S33 may be configured to select the respective memory cell MC11 to MC33, and include switching material. Each of the select elements S11 to S33 may be a diode, a PNP diode, a bipolarjunction transistor (BJT), a metal insulator transition (MIT) element, a mixed ionic-electronic conducting (MIEC) element, an ovonic threshold switching (OTS) element, or the like.

The shape and the configuration of each of the memory cells MC11 to MC33 may be changed in various ways. For example, the select elements S11 to S33 may be omitted, or data may be stored in the select elements S11 to S33, and the memory elements M11 to M33 may be omitted, or the positions of the select elements S11 to S33, and the memory elements M11 to M33 may be switched with each other. In other words, the select elements S11 to S33 may be electrically coupled to the column lines BL1 to BL3, and the memory elements M11 to M33 may be electrically coupled to the row lines WL1 to WL3.

The semiconductor memory may further include the column circuit 110 configured to control the column lines BL1 to BL3, and the row circuit 120 configured to control the row lines WL1 to WL3.

The row circuit 120 may be a row decoder, a word line decoder, a word line driver, or the like. The row circuit 120 may select a row line WL2 among the row lines WL1 to WL3 based on a row address R ADD. The column circuit 110 may be a column decoder, a bit line decoder, a bit line driver, or the like. The column circuit 110 may select a column line BL2 among the column lines BL1 to BL3 based on a column address C ADD. In this case, the memory cell MC22 coupled between the selected column line BL2 and the selected row line WL2 may be selected.

In FIG. 1A, there has been illustrated the case where the three column lines BL1 to BL3 and the three row lines WL1 to WL3 are provided, but this is only for the sake of description. The present disclosure is not limited to this. The number of column lines BL1 to BL3 or row lines WL1 to WL3 included in the cell array 100 may be changed as needed.

Referring to FIG. 1B, the memory cell array may include column lines BL1 to BL3 disposed on a first level and row lines WL1 to WL3 disposed on a second level. For example, the column lines BL may be disposed over the row lines WL. The row lines WL1 to WL3 may extend in a first direction I, and the column lines BL1 to BL3 may extend in a second direction II intersecting with (e.g., orthogonal to) the first direction I.

The row lines WL1, WL2, and WL3 may be respectively coupled to the row circuit through row contact plugs WCT1, WCT2, and WCT3. The row contact plugs WCT1 to WCT3 may have respective different resistances, or may have different resistances for groups.

The column lines BL1, BL2, and BL3 may be respectively coupled to the column circuit 110 of FIG. 1A through column contact plugs BCT1, BCT2, and BCT3. The column contact plugs BCT1 to BCT2 may have respective different resistances, or may have different resistances for groups.

The memory cells MC11 to MC33 may be disposed at intersections of the column lines BL1 to BL3 and the row lines WL1 to WL3, and may be arranged in the form of a matrix. Furthermore, each of the memory cells MC11 to MC33 may be a memory stack, and include a memory element M and a select element S which are stacked in a third direction III. Here, the third direction III may be a direction intersecting with the first direction I and the second direction II, and may be a direction perpendicular to the first direction I and the second direction II.

Although this drawing illustrates that the cell array has a single-deck structure, the present disclosure is not limited thereto. The memory cells MC may be stacked in the third direction III. For example, the cell array may have a multi-deck structure such that the row lines WL and the column lines BL are alternately stacked in the third direction III. In this case, memory cells are disposed between the row lines WL and the column lines BL that are alternately stacked.

Figure 1C:
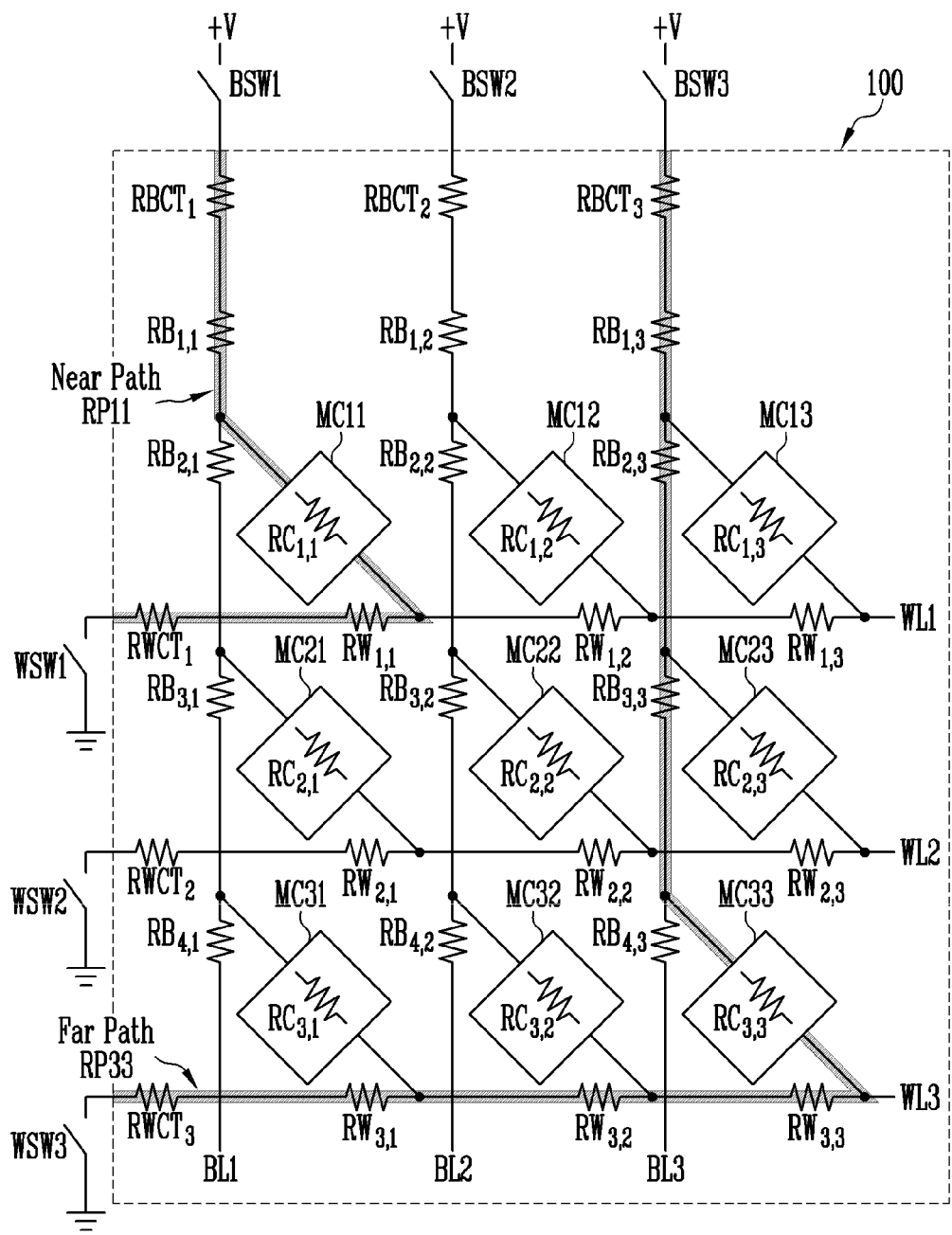
FIG. 1C illustrates resistances and current paths in the electronic device of FIGS. 1B and 1C, according to an embodiment.

FIG. 1C illustrates resistances of the memory cell array 100 including memory cells MC11 to MC33, and current paths to near memory cell MC11 and far memory cell MC33 of the memory cell array 100. Memory cell MC11 is considered a near memory cell because it is physically close (compared to other memory cells) to the row contact plugs WCT1 to WCT3 and close to the column contact plugs BCT1 to BCT3. Memory cell MC33 is considered a far memory cell because it is physically distant (compared to other memory cells) to the row contact plugs WCT1 to WCT3 and distant to the column contact plugs BCT1 to BCT3. Other memory cells may also be considered near and far.

In an embodiment, a current may be provided to a memory cell through a path by coupling the respective column line to a voltage source and the respective row line to ground. For example, a current may be supplied to the near memory cell MC11 through a near path shown in FIG. 1C by closing a first row switch WSW1 and a first column switch BSW1, and a current may be supplied to the far memory cell MC33 through a far path shown in FIG. 1C by closing a third row switch WSW3 and a third column switch BSW3.

The resistance of a path RPij used to supply current to a memory cell MCij by this mechanism is equal to:

$$RPij = RWCTi + RBCTj + \sum_{x=1}^{j} RWx, j + \sum_{y=1}^{i} RBi, y + RCi, j \quad \text{Equation 1}$$

wherein RWCTi is a resistance of row contact plug WCTi, RBCTj is a resistance of column contact plug BCTj, RWx,j is a resistance of a $i^{th}$ portion of the $x^{th}$ row line WLx, RBi,y is a resistance of an $i^{th}$ portion of the $y^{th}$ column line BLy, and RCi,j is a resistance of memory cell MCij Accordingly, a resistance of the near path RP11 of the near memory cell MC11 is less than a resistance of the far path RP33 of the far memory cell MC33. Assuming the resistances of each of RWx,y are equal to a same value RWnorm corresponding to a resistance of a portion of the row line having a length equal to a column spacing of the memory cells, the resistances of each of RBx,y are equal to a same value RBnorm corresponding to a resistance of a portion of the column line having a length equal to a row spacing of the memory cells, and the resistance RCx,y of each of memory cell are equal, the difference in the resistance of a first path RPab and a second path RPcd is:

RPcd−RPab=(RWCTc−RWCTa)+(RBCTd−RBCTb)+
((c−a)+(d−b))×RWnorm     Equation 2 wherein ((c−a)+(d−b))×RWnorm corresponds to an array wiring resistance difference proportional to differences in the sum of the lengths of the included portions of the respective row and column lines of each path, wherein the included portion of a line is the portion between the contact plug coupled to the line and the memory cell. For example, the difference in the resistance between the far path RP33 and the near path RP11 is equal to (RWCT3−RWCT1)+(RBCT3−RBCT1)+4×RWnorm, wherein the 4×RWnorm terms corresponds to the array wiring resistance difference.

When the number of rows and columns is large, the array wiring resistance difference may be large as well. For example, in memory cell array having 128 rows and 130 columns, the array wiring resistance difference may be 256×RWnorm. If this large array wiring resistance difference is not compensated for, an excess of current may be supplied to near memory cells, or the current supplied to far memory cells may be insufficient.

Embodiments compensate for array wiring resistance differences by varying the resistance in elements of the paths through the array. In particular, embodiments increase a resistance of contact plugs of lines connected to memory cells having short or low-resistance current paths.

In an embodiment, a row contact plug connected to a near memory cell (for example, row contact plug WCT1 in FIG. 1B) has a higher resistance than a row contact plug connected to a far memory cells (for example, row contact plug WCT3 in FIG. 1B) in order to compensate for an array wiring resistance difference between a near path that includes the row contact plug connected to the near memory cell and a far path that includes the row contact plug connected to the far memory cell. For example, the resistance $RWCT_1$ of row contact plug WCT1 may be greater than the resistance RWCT3 of row contact plug WCT3 by a fraction (e.g., 33%) of the difference between the far path resistance RP33 and the near path resistance RP11.

In an embodiment, a column contact plug connected to a near memory cell (for example, column contact plug BCT1 in FIG. 1B) has a higher resistance than a column contact plug connected to a far memory cells (for example, column contact plug BCT3 in FIG. 1B) in order to compensate for an array wiring resistance difference between a near path that includes the column contact plug connected to the near memory cells and a far path that includes the column contact plug connected to the far memory cell. For example, the resistance $RBCT_1$ of column contact plug BCT1 may be greater than the resistance $RBCT_3$ of column contact plug BCT3 by a fraction (e.g., 33%) of the difference between the far path resistance RP33 and the near path resistance RP11.

In an embodiment, both a row contact plug resistance and a column contact plug resistance are given a higher resistance, as described above, to compensate for array wiring resistance differences. Processes for producing first and second sets of contract plugs wherein the first set of contact plugs have a higher resistance than the second set of contacts will be described below with respect to FIGS. 4A to 4H and FIGS. 5A to 5D.

According to the above-described resistance of the near path of the near memory cell MC11 structure, since the memory cells MC11 to MC33 are arranged in a cross-point array structure, the degree of integration of memory elements may be enhanced. Furthermore, since the memory cells MC may be stacked in a multi-deck structure, the degree of integration of memory elements may be further enhanced. In addition, the row contact plugs WCT1 to WCT3 or the column contact plugs BCT1 to BCT3 or both may have different resistances to prevent differences in the respective resistances of current paths of the memory cells from producing over currents in the memory cells.

Figure 2A:
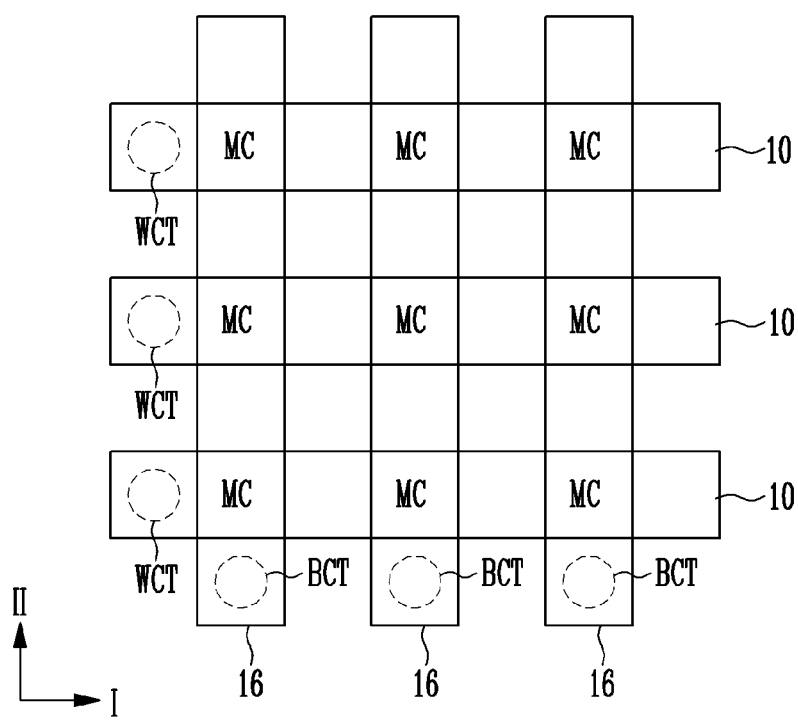
Figure 2B:
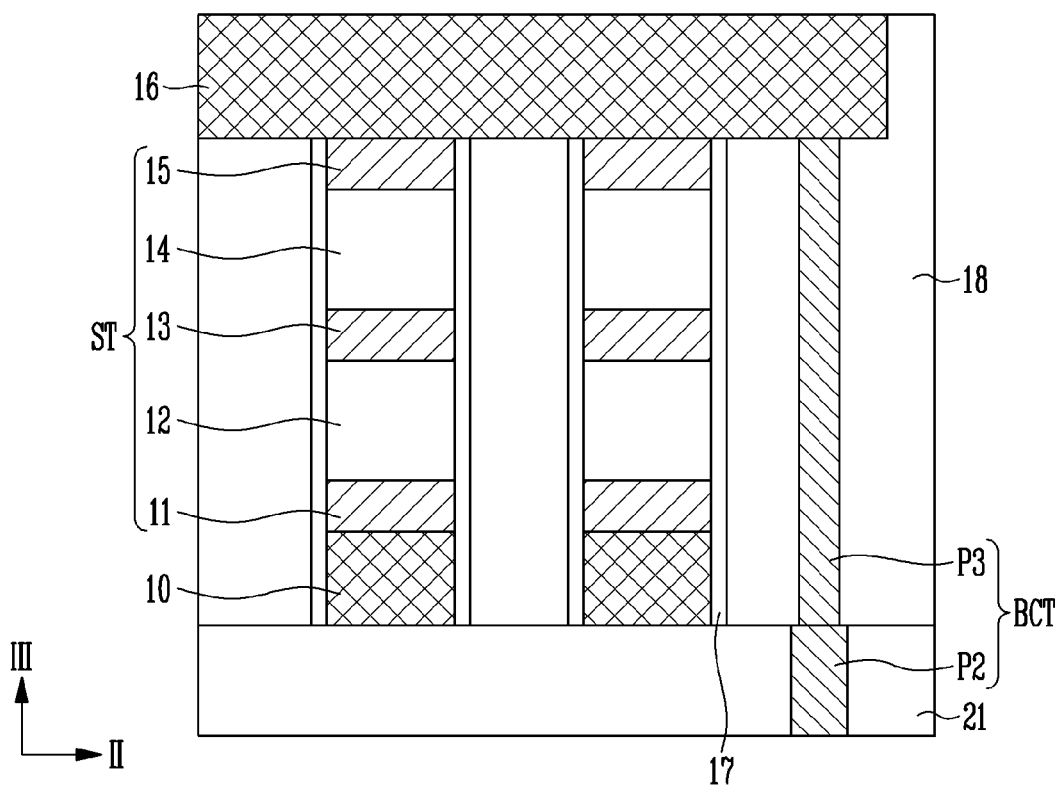

FIGS. 2A to 2C are diagrams illustrating the structure of the electronic device according to an embodiment of the present disclosure. FIG. 2A is a layout diagram, FIG. 2B is a sectional view taken in the second direction II of FIG. 2A, and FIG. 2C is a sectional view taken in the first direction I of FIG. 2A.

Referring to FIGS. 2A to 2C, the electronic device in accordance with an embodiment of the present disclosure may include a stack ST, first and second passivation layers 17 and 19, insulating layers 18, 20, and 21, row contact plugs WCT, and column contact plugs BCT. Each of the memory cells MC may include the stack ST. The stack ST may be disposed in an intersection area between a row line 10 and a column line 16. The first and second passivation layers 17 and 19 may be formed on sidewalls of the stacks ST. Space between the stacks ST may be filled with the insulating layers 18 and 20.

Each of the stacks ST may include a lower electrode 11, a switching layer 12, an intermediate electrode 13, a variable resistance layer 14, and an upper electrode 15 which are successively stacked.

The variable resistance layer 14 may make a reversible transition between different resistance states depending on voltage or current applied thereto. Accordingly, the variable resistance layer 14 having a low-resistance state may correspond to a data '1' being stored therein and the variable resistance layer 14 having a high-resistance state may correspond to a data '0' being stored therein.

The variable resistance layer 14 may include a resistive material, such as a transition metal oxide, or a metal oxide such as a perovskite-based material, and data may be stored in the variable resistance layer 14 by generating or removing an electrical path therein.

The variable resistance layer 14 may include an MTJ structure that includes a magnetization pinned layer, a magnetization free layer, and a tunnel barrier layer interposed therebetween. The magnetization pinned layer and the magnetization free layer may include magnetic material. The tunnel barrier layer may include oxide such as magnesium (Mg), aluminum (Al), zinc (Zn), and titanium (Ti). The magnetization direction of the magnetization free layer may change depending on spin torque of electrons in current applied thereto. Therefore, data may be stored by changing a magnetization direction of the magnetization free layer with respect to the magnetization direction of the magnetization pinned layer.

The variable resistance layer 14 may be phase-change material that includes chalcogenide-based material. The variable resistance layer 14 may include, as the chalcogenide-based material, silicon (Si), germanium (Ge), antimony (Sb), tellurium (Te), bismuth (Bi), indium (In), tin (Sn), selenium (Se), or a combination thereof. For example, the variable resistance layer 14 may have a Ge—Sb—Te (GST) structure, and be formed of $Ge_2Sb_2Te_5$, $Ge_2Sb_2Te_7$, $Ge_1Sb_2Te_4$, or $Ge_1Sb_4Te_7$. Here, the chemical composition ratio of the variable resistance layer 14 may be determined taking into account characteristics such as melting point and crystallization temperature. The variable resistance layer 14 may further include impurities such as carbon (C) and nitrogen (N). The phase-change material has low-resistance characteristics in a crystalline state, and has high-resistance characteristics in an amorphous state. Therefore, data may be stored in the variable resistance layer 14 using a set operation that changes the variable resistance layer 14 from the amorphous state having high-resistance characteristics to the crystalline state having low-resistance characteristics, and a reset operation that changes the variable resistance layer 14 from the crystalline state having low-resistance characteristics to the amorphous state having high-resistance characteristics.

The switching layer 12 may adjust a flow of current depending on the level of voltage or current applied thereto. Therefore, the switching layer 12 may prevent the flow of the current in response to the level of voltage or current applied thereto being equal or less than a predetermined threshold value, and allow the flow of in response to the level of voltage or current applied thereto being greater than the predetermined threshold, with the magnitude of the current increasing rapidly in proportion to increases in the applied voltage or current above the predetermined threshold.

The switching layer 12 may be a metal insulator transition (MIT) element that includes any of $VO_2$, $NbO_2$, $TiO_2$, $WO_2$, $TiO_2$, or the like. The switching layer 12 may be a mixed ion-electron conducting (MIEC) element that includes any of $ZrO_2(Y_2O_3)$, $Bi_2O_3$—BaO, $(La_2O_3)x(CeO_2)_{1-x}$, or the like. The switching layer 12 may be an ovonic threshold switching (OTS) element that includes a chalcogenide-based material such as $As_2Te_3$, $As_2$, or $As_2Se_3$.

The lower electrode 11 may be electrically coupled to the row line 10. The intermediate electrode 13 may be interposed between the switching layer 12 and the variable resistance layer 14. The upper electrode 15 may be electrically coupled to the column line 16. The lower electrode 11, the intermediate electrode 13, and the upper electrode 15 may include conductive material such as metal and metal nitride. For example, each of the lower electrode 11, the intermediate electrode 13, and the upper electrode 15 may include any of tungsten (W), tungsten nitride (WN), tungsten silicide (WSi), titanium (Ti), titanium nitride (TiN), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn), nickel (Ni), cobalt (Co), lead (Pd), platinum (Pt), etc., or a combination thereof.

Each of the lower electrode 11, the intermediate electrode 13, and the upper electrode 15 may have a single-layer structure or a multi-layer structure. The lower electrode 11, the intermediate electrode 13, and the upper electrode 15 may have the same thickness or different thicknesses. In addition, the shape and configuration of the stack ST may be changed in various ways. For instance, at least one of the lower electrode 11, the intermediate electrode 13, and the upper electrode 15 may be omitted.

The first and second passivation layers 17 and 19 are provided to protect the stacks ST during a fabricating process, and may be formed on the sidewalls of the stacks ST. Here, the first passivation layer 17 may be formed to enclose sidewalls of the stack ST that are opposite to each other in the second direction II, and may extend in the first direction I. The second passivation layer 19 may be formed to enclose sidewalls of the stack ST that are opposite to each other in the first direction I, and may extend in the second direction II. The first and second passivation layers 17 and 19 may be formed of nonconductive material, and include one or more of oxide, nitride, polysilicon, etc. For example, the first and second passivation layers 17 and 19 may include any of silicon oxide (SiOX), silicon nitride (Si3N4), polysilicon, titanium nitride (TiN), tantalum nitride (TaN), etc., or a combination thereof. Furthermore, the first passivation layer 17 may have a single-layer structure or a multi-layer structure.

The insulating layers 18 and 20 may be formed between adjacent stacks ST and provided to charge space between the stacks ST. The insulating layer 18 may fill space between stacks ST that are adjacent to each other in the second direction II. The insulating layer 20 may fill space between stacks ST that are adjacent to each other in the first direction I. For example, the insulating layer 18 may include oxide such as silicon oxide ($SiO_2$), or a flowable oxide layer such as spin on coating (SOC) or spin on dielectric (SOD), or may include a combination thereof.

The row contact plugs WCT may be arranged in the second direction II, and the column contact plugs BCT may be arranged in the first direction I. The row contact plugs WCT may pass through the insulating layer 21 to couple to the respective row lines 10. The column contact plugs BCT may pass through the insulating layers 18 and 21 to couple to the respective column lines 16.

Each of the row contact plugs WCT may include at least one plug P1. For example, each of the row contact plugs WCT may include a first plug P1.

Each of the column contact plugs BCT may include at least a second plug P2 and a third plug P3. The third plug P3 may be disposed on an upper portion of the second plug P2. The second plug P2 may pass through the insulating layer 21, and the third plug P3 may pass through the insulating layer 18. The second plug P2 may be disposed at substantially the same level as that of the first plug P1.

In an embodiment, the column contact plugs BCT may be produced with different resistances.

In another embodiment, groups of column contact plugs BCT may be produced with each column contact plug BCT in a group having a group-specific resistance, wherein each of the group-specific resistance for each group is different from the group-specific resistance of other groups.

In an embodiment, a first column contact plug BCT having a higher resistance than a second column contact plug BCT may include a region having a higher oxygen concentration compared to the corresponding region in the second column contact plug BCT.

In an embodiment, a second plug P2 of the first column contact plugs BCT may have an upper region having a higher oxygen content than a corresponding upper region of a second plug P2 of the second column contact plugs BCT. The oxygen concentration of the upper region of the second plug P2 of the first column contact plug BCT may have been increased by a surface treatment which the second plug P2 of the second column contact plug BCT was not subjected to.

In another embodiment, the second plug P2 of the first column contact plugs BCT may be partially oxidized by the surface treatment. Therefore, an oxidation pattern may be interposed between the second plug P2 and the third plug P3 of the first column contact plugs BCT.

A column contact plug BCT that has an increased oxygen concentration or the oxidation pattern on the surface of its second plug P2 may have a higher resistance compared to other column contact plugs BCT. The column contact plugs BCT having different resistances may prevent a difference in current paths between the memory cells MC from causing the application of an over current to some memory cells MC.

In an embodiment, the row contact plugs WCT may be produced with different resistances.

In another embodiment, groups of row contact plugs WCT may be produced with each row contact plug WCT in a group having a group-specific resistance, wherein each of the group-specific resistance for each group is different from the group-specific resistance of other groups.

In an embodiment, a first plug P1 of the first row contact plugs WCT may have an upper region having a higher oxygen content than a corresponding upper region of a first plug P1 of the second row contact plug WCT. The oxygen concentration of the upper region of the first plug P1 of the first row contact plug WCTs may have been increased by a surface treatment which the first plug P1 of the second row contact plugs WCT were not subjected to.

In another embodiment, the first plug P1 of the first row contact plugs WCT may be partially oxidized by the surface treatment. Therefore, an oxidation pattern may be interposed between the first plug P1 and the respective row line 10 of the first row contact plugs WCT.

A row contact plug WCT that has an increased oxygen concentration or the oxidation pattern on the surface of its first plug P1 may have a higher resistance compared to other row contact plugs WCT. The row contact plugs WCT having different resistances may prevent an over current from being applied to some memory cells MC due to a difference in current paths between the memory cells MC.

In an embodiment, at least one column contact plug BCT and at least one row contact plug WCT are each surface-treated as described above to have a higher resistance.

FIGS. 3A to 3D illustrate the structure of the electronic device in accordance with an embodiment of the present disclosure.

Figure 3A:
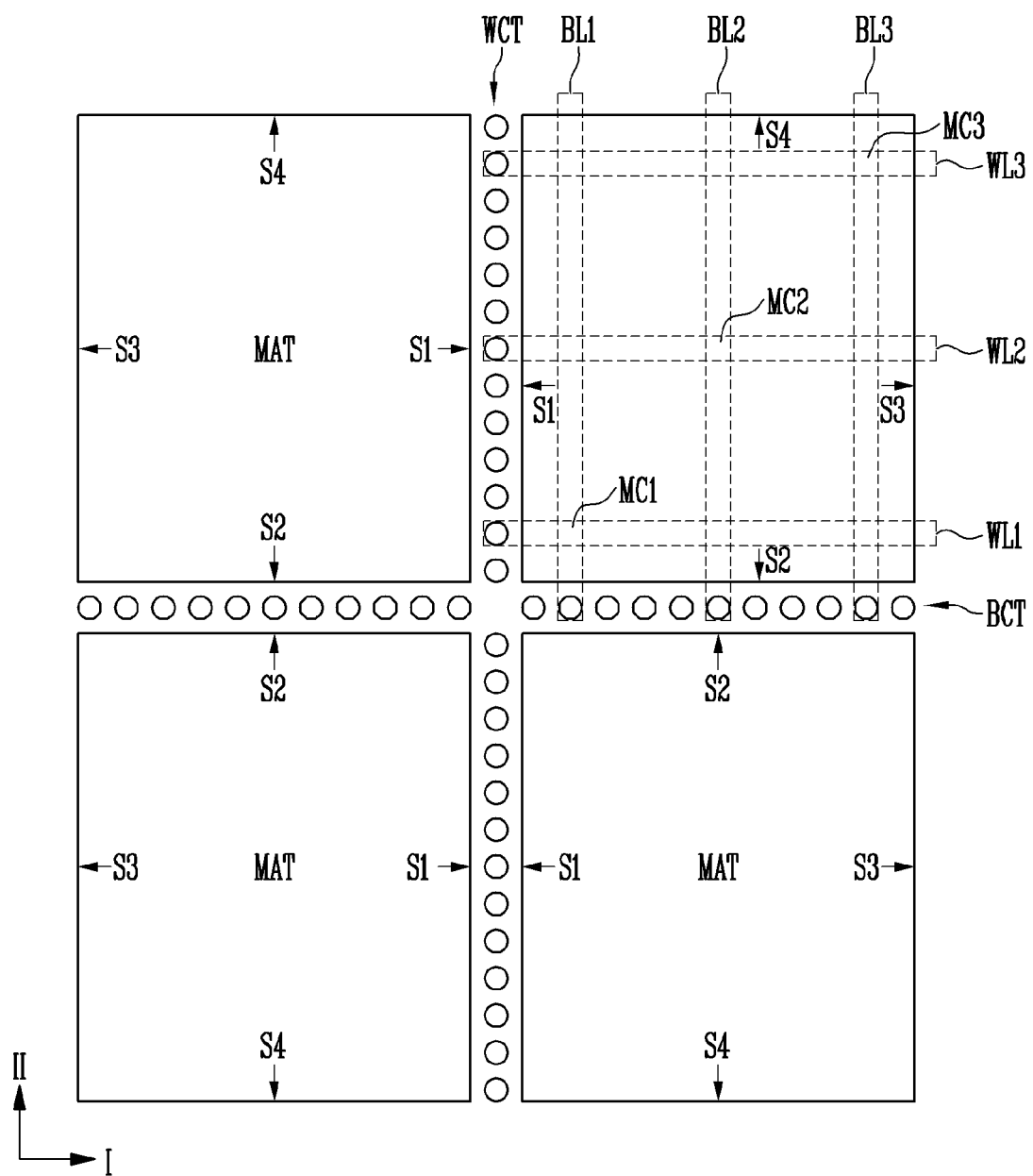
FIGS. 3A, 3B, 3C, and 3D illustrate the structure of an electronic device in accordance with an embodiment.

Referring to FIG. 3A, the electronic device in accordance with an embodiment of the present disclosure may include a plurality of mats MAT. Here, each mat MAT may be the unit of performing a write or a read operation. For example, each of the mats MAT may independently perform a write or a read operation.

Each mat MAT may include first to fourth sides S1 to S4. The first side S1 and the third side S3 may face each other in the first direction I and extend in the second direction II. The second side S2 and the fourth side S4 may face each other in the second direction II and extend in the first direction I.

The contact plugs WCT and BCT may be disposed around each mat MAT or between adjacent mats MAT. For example, the row contact plugs WCT may be arranged along the first side S1 in the second direction II. The column contact plugs BCT may be arranged along the second side S2 along the first direction I.

Each mat MAT may include a plurality of memory cells arranged in the first direction I and the second direction II. Furthermore, memory cells included in the mat MAT may be coupled to the row contact plugs WCT through row lines, and may be coupled to the column contact plugs BCT through column lines. Therefore, each memory cell may have a current path through which current flows during a write or a read operation.

The current path may be a path through which current flows from the row contact plugs WCT to the column contact plugs BCT via the memory cells. For example, the current path of the first memory cell MC1 may include a row contact plug WCT of a row line WL1, a portion of the row line WL1 from its row contact plug BCT to the first memory cell MC1, a portion of the column line BL1 from the first memory cell MC1 to a column contact plug BCT of the column line BL1, and the column contact plug BCT of the column line BL1. The current path of the second memory cell MC2 may include a row contact plug WCT of a row line WL2, a portion of the row line WL2 from its row contact plug BCT to the second memory cell MC2, a portion of the column line BL2 from the second memory cell MC2 to a column contact plug BCT of the column line BL2, and the column contact plug BCT of the column line BL2. The current path of the third memory cell MC3 may include a row contact plug WCT of a row line WL3, a portion of the row line WL3 from its row contact plug WCT to the third memory cell MC3, a portion of the column line BL3 from the third memory cell MC3 to a column contact plug BCT of the column line BL3, and the column contact plug BCT of the column line BL3. A resistance of each path may be equal to a sum of the resistances of the features includes in that path.

Therefore, the length of the current path of each memory cell may change depending on the position of the memory cell in the mat MAT. For example, the current path of the second memory cell MC2 is longer than the current path of the first memory cell MC1, and the current path of the third memory cell MC3 is longer than the current path of the second memory cell MC2. An array wiring resistance of each path may increase in proportion to the length of the path. Thus the area of each mat MAT may be divided into areas according to lengths of the current paths of the memory cells therein to divide the memory cells into areas according to their respective array wiring resistances.

Figure 3B:
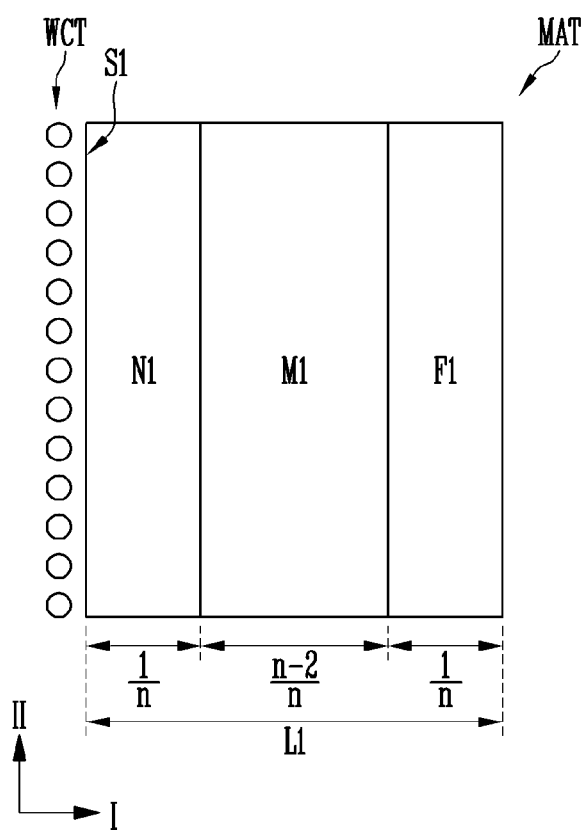

Referring to FIG. 3B, the area of the mat MAT may be divided into areas based on the corresponding row contact plugs WCT. The row contact plugs WCT may be arranged in the second direction II along the first side Si of the mat MAT. Therefore, among the paths on the row lines, the maximum distance between the row contact plug WCT and the memory cell may be L1 which is the length of the mat MAT in the first direction I. When it is assumed that the length L1 of the mat MAT in the first direction I is divided into n parts, an area extending from the row contact plug WCT to 1/n may be referred to as area N1, an area extending from area N1 to (n−2)/n may be referred to as area M1, and an area extending from area M1 to 1/n may be referred to as area F1. Here, n may be an integer of 2 or more. In this way, the area of the mat MAT may be divided into parts according to the distance of the path on the row line. Area N1 may include memory cells having relatively short paths on the row lines. Area F1 may include memory cells having relatively long paths on the row lines. Area M1 may be the other area except area N1 and area F1.

Figure 3C:
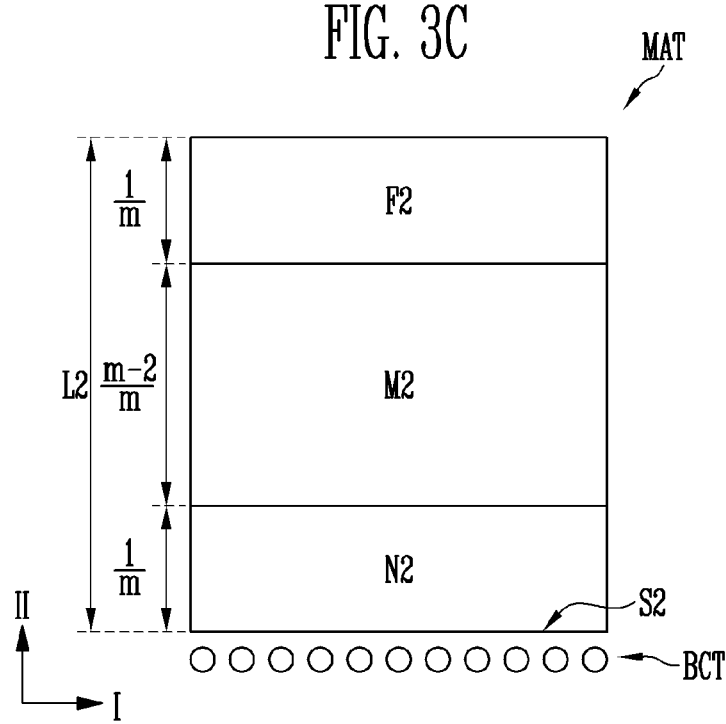

Referring to FIG. 3C, the area of the mat MAT may be divided into areas based on the corresponding column contact plugs BCT. The column contact plugs BCT may be arranged in the first direction II along the second side S2 of the mat MAT. Therefore, among the paths on the column lines, the maximum distance between the column contact plug BCT and the memory cell may be L2 which is the length of the mat MAT in the second direction II. When it is assumed that the length L2 of the mat MAT in the second direction II is divided into m parts, an area extending from the column contact plug BCT to 1/m may be referred to as area N2, an area extending from area N2 to (m−2)/m may be referred to as area M2, and an area extending from area M2 to 1/m may be referred to as area F2. Here, m is an integer of 2 or more. In this way, the area of the mat MAT may be divided into parts according to the distance of the path on the column line. Area N2 may include memory cells having relatively short paths on the column lines. Area F2 may include memory cells having relatively long paths on the column lines. Area M2 may be the other area except area N2 and area F2.

Figure 3D:
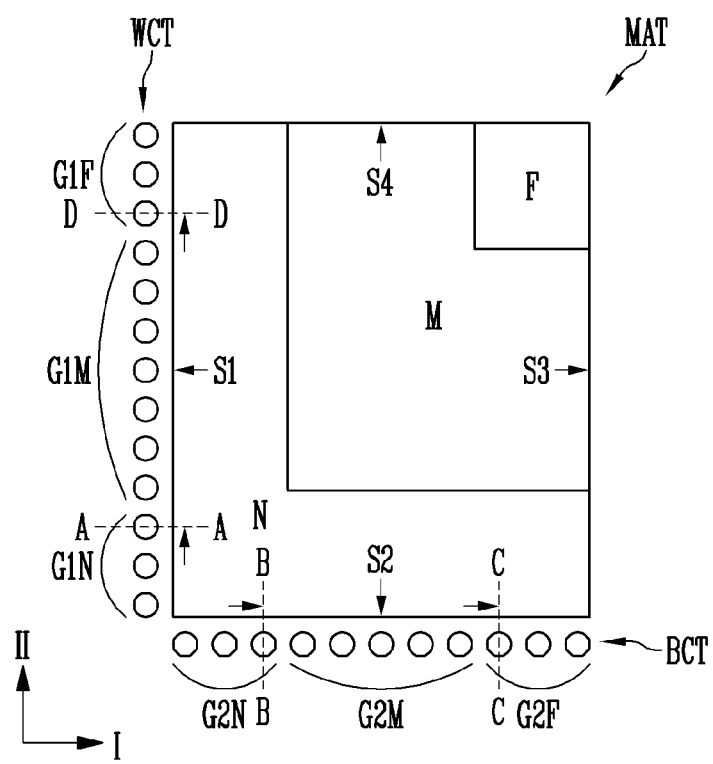

Referring to FIG. 3D, the area of the mat MAT may be divided into areas according to a combination of the row and column lengths of the current path. A near area N may be an area in which memory cells having relatively short current paths are disposed, and may correspond to a union of area N1 of FIG. 3B and area N2 of FIG. 3C. A far area F may be an area in which memory cells having relatively long current paths are disposed, and may correspond to an intersection of area F1 of FIG. 3B and area F2 of FIG. 3C. A mid area M may be an area of the mat MAT other than near area N and far area F. In embodiments according to FIG. 3D, n of FIG. 3B and m of FIG. 3C may have the same value.

Since the memory cells disposed in areas F, M, and N have different current paths, then in devices of the prior arts (wherein, for example, the column contact plugs BCT may have substantially the same resistance as each other and the row contact plugs WCT may have substantially the same resistance as each other) the amounts of current applied to the memory cells of areas F, M, and N during an operation of the electronic device may differ from each other depending on the location of the memory cell receiving the current. In the case of a memory cell disposed in near area N, relatively large current may be applied to the memory cell because a resistance on the current path is low. As a result, during a write operation, over current may be applied to a memory cell in near area N, whereby the memory cell may be damaged.

Therefore, to compensate for a difference in resistance due to a difference in length of the current path, the resistance values of some of the row contact plugs WCT may be adjusted, the resistance values of some of the column contact plugs BCT may be adjusted, or the resistance values of the some of the row contact plugs WCT and some of the column contact plugs BCT may be adjusted.

In the case where the resistance values of the column contact plugs BCT are adjusted, the column contact plugs BCT may have respective different resistance values, or may be grouped together and have a resistance value according to the group they are in, wherein each the groups have respective different resistance values.

A column contact plug BCT having a short current path on the row lines WL1 to WL3 may have a higher resistance (resulting from, for example, an oxide pattern disposed across a surface thereof or having a portion having a higher oxygen concentration) compared to that of a column contact plug BCT having a long current path on the row lines WL1 to WL3. For example, referring to FIG. 3A, a column contact plug BCT connected by column line BL1 to a memory cell MC4 having a short distance between the row contact plug WCT to the memory cell MC4 may have a higher resistance compared to a column contact plug BCT connected by column line BL2 to a memory cell MC2 having a longer distance between the row contact plug WCT to the memory cell MC2. Therefore, column contact plugs BCT that are adjacent to or nearer to the first side Si may have higher resistances compared to that of column contact plugs BCT that are adjacent to or nearer to the third side S3.

Furthermore, if the column contact plugs BCT are divided into groups, a group that is adjacent to the first side S1 may have a higher resistance compared to that of a group that is adjacent to the third side S3. The groups of column contact plugs BCT may include near column group G2N corresponding to area N1 of FIG. 3B, mid column group G2M corresponding to area M1, and far column group G2F corresponding to area F1. In this case, resistances of the column contact plugs BCT of the respective groups G2N, G2M, and G2F may each be equal to respective group resistance values RG2N, RG2M, and RG2F which satisfy RG2N>RG2M>RG2F.

Likewise, it is also possible to adjust the resistance values of the row contact plugs WCT. In this case, row contact plugs WCT that are adjacent or nearer to the second side S2 may have higher resistances compared to that of row contact plugs WCT that are adjacent or nearer to the fourth side S4. In addition, groups of the row contact plugs WCT may include near row group G1N corresponding to area N2 of FIG. 3B, mid row group G1M corresponding to area M2, and far row group G1F corresponding to area F2. In this case, resistances of the row contact plugs WCT of the respective groups G1N, G1M, and G1F may each be equal to respective group resistance values RG2N, RG2M, and RG2F which satisfy RG1N>RG1M>RG1F.

As shown in FIG. 3D, row contact plugs WCT may be grouped according to their respective distances from the second side S2 that the column contact plugs BCT are disposed along, and column contact plugs BCT may be grouped according to their respective distances from the first side Si that the row contact plugs WCT are disposed along. Equivalently, each row contact plug WCT may be grouped according to a length or resistance of portions of the column lines that couple the memory cells coupled to the row contact plug WCT to the column contact plugs BCT, and each column contact plug BCT may be grouped according to a length or resistance of portions of the row lines that couple the memory cells coupled to the column contact plugs BCT to the row contact plugs WCT. For example, column contact plugs BCT may be grouped into the near column group G2N when respective lengths or resistances LR of the row lines coupling the respective memory cells that are coupled to the column contact plugs BCT are less than a first predetermined value, grouped into the mid column group G2M when the lengths or resistances LR are greater than the first predetermined value and less than a second predetermined value, and grouped into the far column group G2F when the lengths or resistances LR are greater than the second predetermined value.

Thereby, contact plugs coupled to a relatively short current path may have higher resistance values compared than contact plugs coupled to a relatively long current path. Consequently, a difference in array wiring resistance due to a difference in length of the current path may be compensated for, so that over current may be prevented from being applied to the memory cells included in areas of the map having lower array wiring resistance. In embodiments, the areas of the map having lower array wiring resistance may correspond to area N1 of FIG. 3B, or correspond to area N2 of FIG. 3C, or correspond to near area N of FIG. 3D.

FIGS. 4A to 4H are sectional views illustrating a process for fabricating the semiconductor device in accordance with an embodiment of the present disclosure. Each of FIGS. 4A to 4H include a sectional view A in the first direction I along a line A-A of FIG. 3D, a sectional view B along a line B-B of FIG. 3D in the second direction II, and a sectional view C along a line C-C of FIG. 3D in the second direction II. Hereinbelow, repetitive explanation will be omitted if deemed redundant.

Figure 4A:
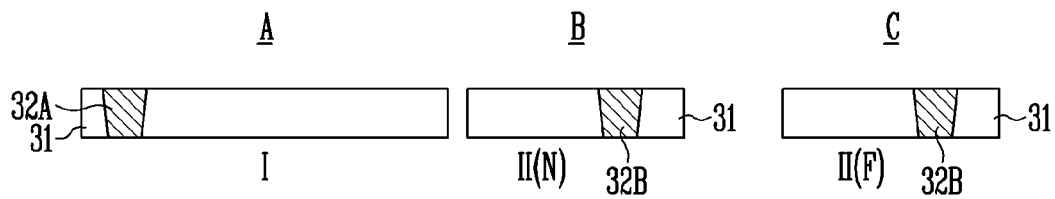
FIGS. 4A, 4B, 4C, 4D, 4E, 4F, 4G, and 4H illustrate a portion of a process for fabricating a semiconductor device in accordance with an embodiment.

Referring to FIG. 4A, an insulating layer 31 is formed on a substrate (not shown) provided with a lower structure. The lower structure may include a peripheral circuit, etc. for driving a cell array. The insulating layer 31 may include one or more of oxide, silicon oxide, silicon nitride, silicon oxynitride, low-K dielectric material, etc. or a combination thereof.

Subsequently, first plugs 32A and second plugs 32B are formed to pass through the insulating layer 31. Here, the first plugs 32A may be arranged in the second direction II, and the second plugs 32B may be arranged in the first direction I. The first plugs 32A and the second plugs 32B may be disposed at substantially the same level, and include substantially the same material. The first plugs 32A and the second plugs 32B are conductive and may include any of metal, metal nitride, metal oxide, metal silicide, conductive carbon, polysilicon, etc., or a combination thereof.

Furthermore, the first plugs 32A and the second plugs 32B may be formed together. For example, contact holes may be formed to pass through the insulating layer 31, and a conductive layer formed that fills the contact holes. Thereafter, a planarization process, e.g., a chemical mechanical polishing (CMP) process, may be performed until an upper surface of the insulating layer 31 is exposed.

Figure 4B:
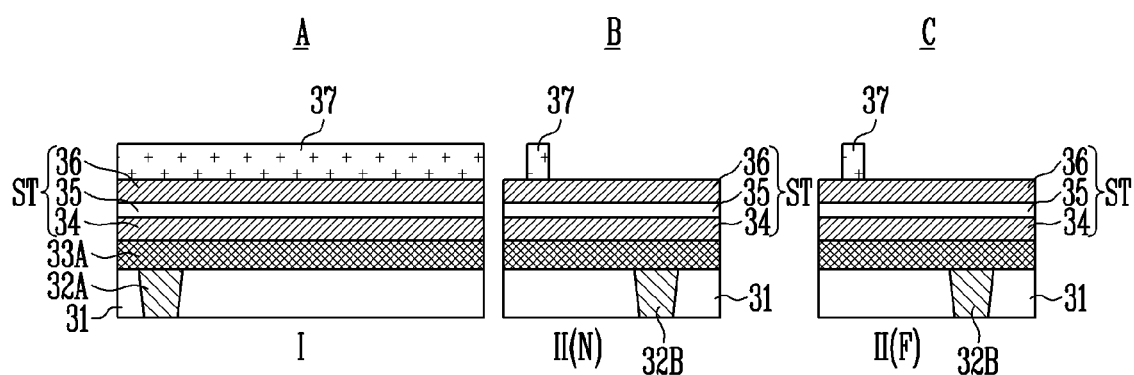

Referring to FIG. 4B, a first line layer 33 is formed on the insulating layer 31, the first plugs 32A, and the second plugs 32B. Here, the first line layer 33 may be provided to form row lines or column lines. The first line layer 33 may be a conductive layer and may include metal such as tungsten.

Thereafter, a stack ST is formed on the first line layer 33, and then a mask pattern 37 is formed on the stack ST. The stack ST may be provided to form memory cells, and include a variable resistance layer 35. For example, the stack ST may include a first electrode layer 34, the variable resistance layer 35, and a second electrode layer 36 which are successively stacked. Furthermore, the stack ST may include a switching layer in lieu of the variable resistance layer 35, or may further include a switching layer and a third electrode layer which are provided on the second electrode layer 36.

Figure 4C:
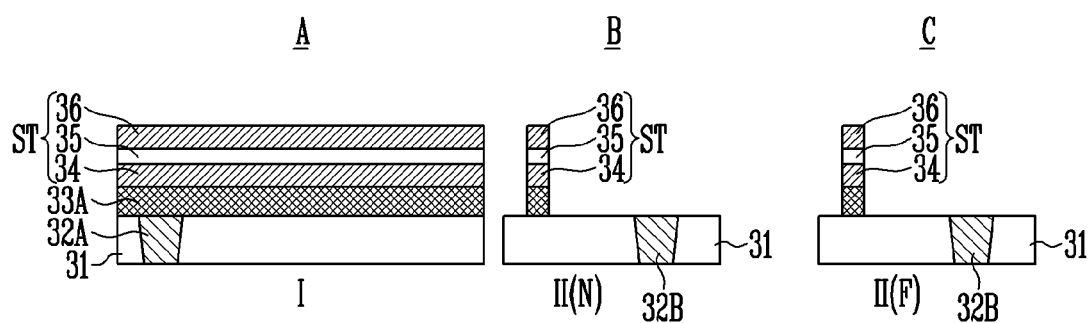

Referring to FIG. 4C, the stack ST and the first line layer 33 are etched using the mask pattern 37 as an etching barrier. Thereby, the first line layer 33 of FIG. 4B is patterned into a plurality of lines extending parallel to each other in the first direction, whereby first lines 33A are formed. Here, the first lines 33A may be coupled to the first plugs 32A. Furthermore, the stack ST is patterned into a plurality of lines extending parallel to each other in the first direction. Thereafter, the remaining mask pattern 37 is removed.

Figure 4D:
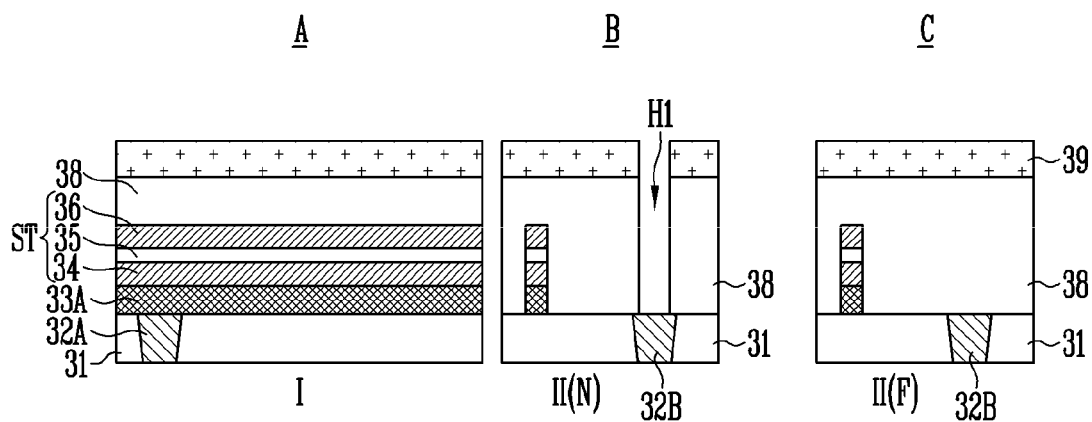

Referring to FIG. 4D, an insulating layer 38 is formed on the stack ST. Here, the insulating layer 38 may include oxide, silicon oxide, silicon nitride, silicon oxynitride, low-K dielectric material, etc., or may include a combination thereof.

Subsequently, first contact holes H1 are formed by forming a mask pattern 39 on the insulation layer 38 and then etching the insulating layer 38 using the mask pattern 39 as an etching barrier. The first contact holes H1 are formed to expose some of the second plugs 32B. For example, the first contact holes H1 may be formed to expose the second plugs 32B included in near column group G2N of FIG. 3D. Here, the mask pattern 39 may include photoresist.

Figure 4E:
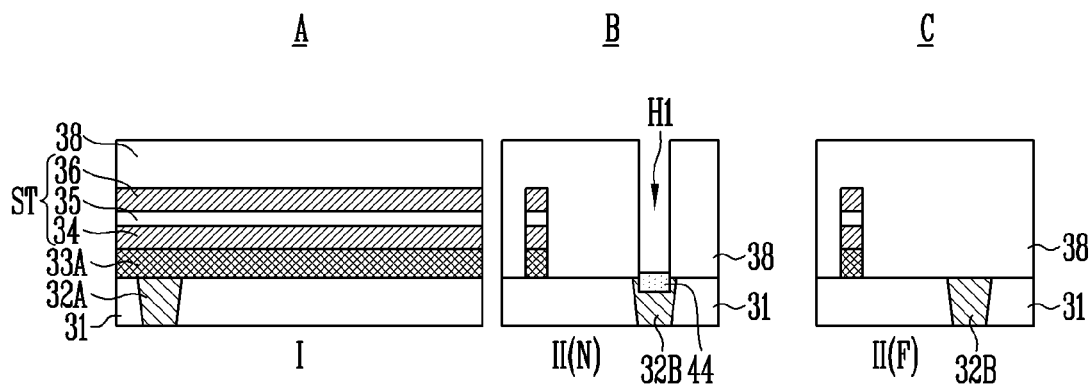

Referring to FIG. 4E, the second plugs 32B that are exposed through the first contact holes H1 are surface-treated to oxidize or increase an oxygen concentration of the surfaces of the second plugs 32B. In an embodiment, a portion of the surface of each of the second plugs 32B may be oxidized to form an oxide pattern 44 on the second plug 32B, thereby increasing the resistance of each second plug.

In an embodiment, when the mask pattern 39 remaining after the first contact holes H1 have been formed is removed, the second plugs 32B may be surface-treated by increasing the flow rate of O2 gas. In another embodiment, when a cleaning process is performed after the first contact holes H1 have been formed, the second plugs 32B may be surface-treated by changing rinse conditions, dry conditions, or both. For example, a rinse time may be increased, or a dry time may be reduced. Here, deionized water may be used as a rinse, and N2 gas may be used during a dry process. The rinse time may range from 10 seconds to 5 minutes. The dry time may range 10 seconds to 5 minutes.

Figure 4F:
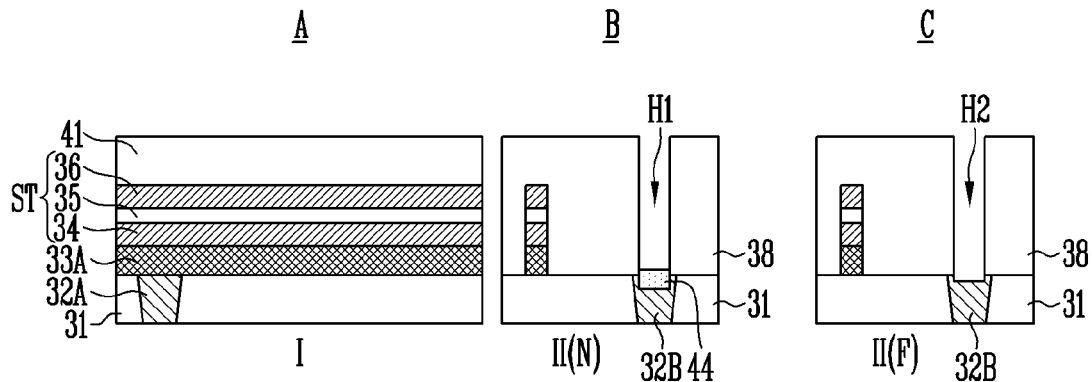

Referring to FIG. 4F, second contact holes H2 are formed through the insulating layer 38 to expose the other second plugs 32B. For example, the second contact holes H2 may be formed to expose the second plugs 32B that are in groups G2M and G2F of FIG. 3D. In some processes, before the second contact holes H2 are formed, the first contact holes H1 may be filled with a sacrificial layer formed of SOC, hard mask material, or the like, and after the second contact holes H2 have been formed, the first contact holes H1 may opened again by removing the sacrificial layer.

Figure 4G:
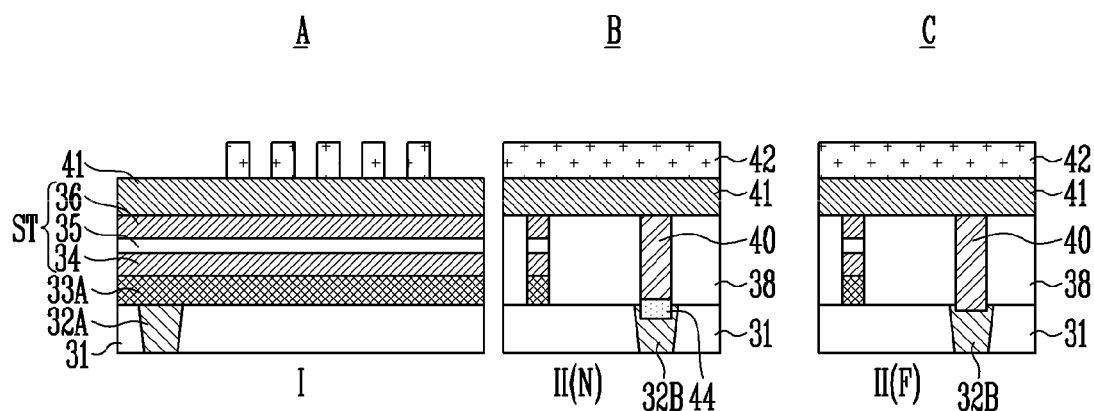

Referring to FIG. 4G, third plugs 40 are formed in the first and second contact holes H1 and H2. For example, the third plugs 40 may be formed by forming a conductive layer to fill the first and second contact holes H1 and H2 with the conductive layer and performing a planarization process.

Thereafter, a second line layer 41 is formed on an intermediate product provided with the third plugs 40, and a mask pattern 42 is formed on the second line layer 41. Here, the second line layer 41 may be provided to form column lines or row lines. The second line layer 41 is conductive and may include metal such as tungsten.

Figure 4H:
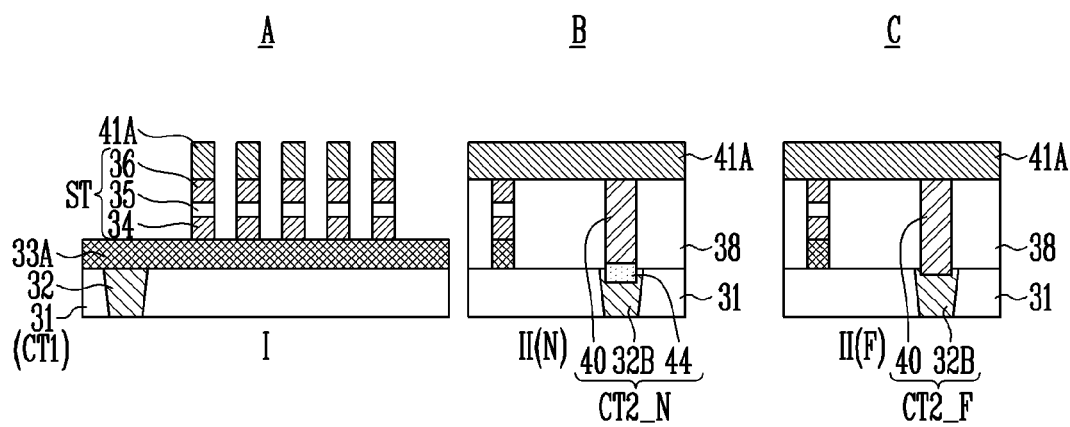

Referring to FIG. 4H, the second line layer 41 and stack ST are etched using the mask pattern 42 as an etching barrier. Thereby, the second line layer 41 is patterned into a plurality of second lines 41A extending parallel to each other in the second direction II. The second lines 41A may be coupled to the third plugs 40. In addition, the stack ST is patterned in the form of islands, and the island-shaped stacks ST are arranged in the first direction I and the second direction II. The island-shaped stacks ST may be disposed at intersections of the first lines 33A and the second 41A.

Using the fabricating process illustrated in FIGS. 4A to 4H, the column contact plugs BCT having different resistance values from each other may be formed. For example, the column contact plugs BCT in group G2N of FIG. 3D may include second plugs 32B, an oxide pattern 44, and third plugs 40, or may include second plugs 32B that have increased oxygen concentrations and third plugs 40. The column contact plug BCT in group G2F FIG. 3D may include second plugs 32B without increased oxygen concentrations and third plugs 40 without including oxide pattern 44.

The first plugs 32A arranged in the second direction II may be row contact plugs WCT. The row contact plugs WCT may be respectively coupled with the first lines 33A, and the column contact plugs BCT may be respectively coupled with the second lines 41A.

Although in the foregoing embodiments the column contact plugs BCT have been described as each having one of two different resistance values, this is only for illustrative purposes, and embodiments of the present disclosure is not limited thereto. For example, the number of operations of forming the contact holes for the third plugs and surface-treating the third plugs may be increased to two or more, producing column contact plugs BCT each having one of three or more resistance values.

Although FIGS. 4A to 4H show the surface processing applied to a subset of the second plugs 32B corresponding to column contact plugs BCT, and not to any of the first plugs 32A, embodiments are not limited thereto. In an embodiment, surface treatment similar to that applied to second plugs 32B in FIGS. 4D and 4E may be applied between the steps shown in FIGS. 4A and 4B to form oxide patterns on or increase the oxygen concentrations of surfaces of one or more of the first plugs 32A. In this way, one or more row contacts plugs WCT (for example, row contact plugs WCT in group G1N of FIG. 3D) may be produced with increased resistance relative to the other row contact plugs WCT. In embodiments, both one or more first plugs 32A and one or more second plugs 32B are surface treated as described with reference to FIGS. 4D and 4E.

FIGS. 5A to 5D are sectional views illustrating a process for fabricating the semiconductor device in accordance with another embodiment of the present disclosure. Each of FIGS. 5A to 5D include a sectional view A in the first direction I along a line A-A of FIG. 3D, a sectional view D in the first direction I along a line D-D of FIG. 3D, and a sectional view B along a line B-B of FIG. 3D in the second direction II.

Figure 5A:
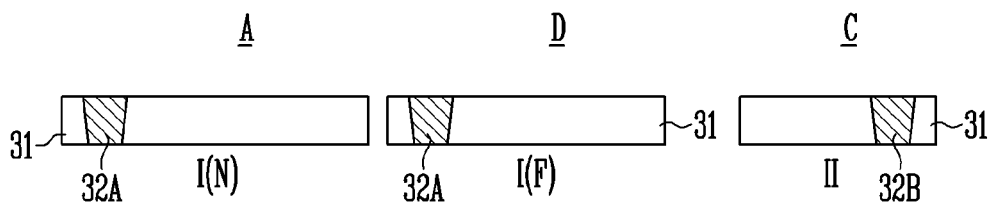
FIGS. 5A, 5B, 5C, and 5D illustrate a portion of a process for fabricating a semiconductor device in accordance with another embodiment.

Referring to FIG. 5A, as in FIG. 4A, an insulating layer 31 is formed on a substrate (not shown) provided with a lower structure. Subsequently, first plugs 32A and second plugs 32B are formed to pass through the insulating layer 31. Here, the first plugs 32A may be arranged in the second direction II, and the second plugs 32B may be arranged in the first direction I.

Figure 5B:
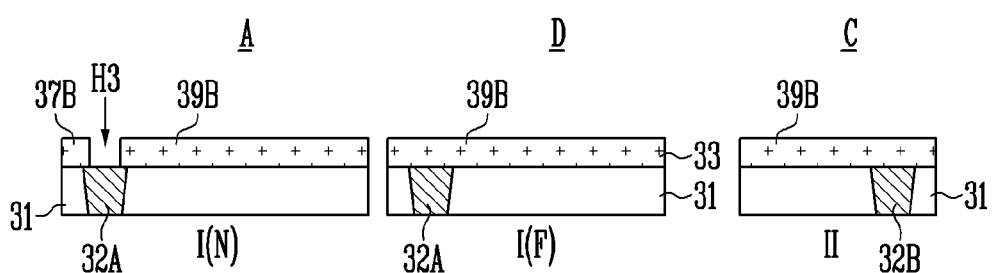

Referring to FIG. 5B, a mask pattern 39B including third contact holes H3 is formed on the insulating layer 21 and the plugs 32A and 32B as an etching barrier. The third contact holes H3 are formed to expose some of the first plugs 32A. For example, the third contact holes H3 may be formed to expose the first plugs 32A included in near row group G1N of FIG. 3D. Here, the mask pattern 39 may include photoresist.

Figure 5C:
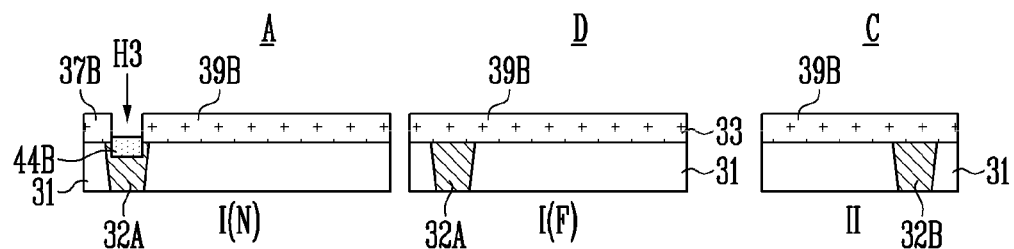

Referring to FIG. 5C, the first plugs 32A that are exposed through the first contact holes H1 are surface-treated to oxidize or increase an oxygen concentration of the surfaces of the exposed first plugs 32A. In an embodiment, a portion of the surface of each of the first plugs 32A may be oxidized to form an oxide pattern 44B on the first plugs 32A, thereby increasing the resistance of each second plug.

In an embodiment, the mask pattern 39B including additional contact holes, the additional contact holes formed to expose some of the second plugs 32B, and the second plugs 32B that are exposed through the first contact holes H1 are surface-treated to oxidize or increase an oxygen concentration of the surfaces of the exposed second plugs 32B.

The surface treatment may be performed according to any of processes described with respect to FIG. 4E (e.g., by increasing a flow of oxygen (02) gas, by changing rinse conditions, by changing dry conditions, etcetera. When the surface treatment of the plugs is finished, the mask pattern 39B is removed.

Figure 5D:
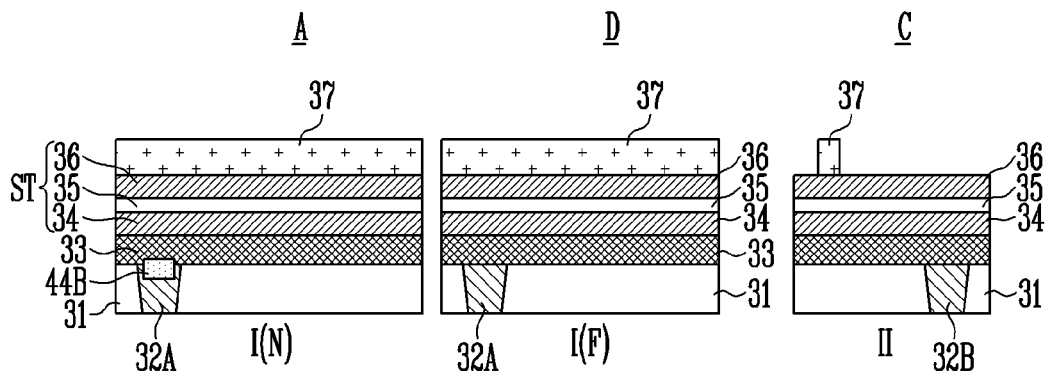

Referring to FIG. 5D, as described with respect to FIG. 4B, a first line layer 33 is formed on the insulating layer 31, the first plugs 32A, and the second plugs 32B. A stack ST is formed on the first line layer 33, the stack ST including, for example, a first electrode layer 34, a variable resistance layer 35, and a second electrode layer 36 which are successively stacked. In embodiments, the stack ST may include a switching layer in lieu of the variable resistance layer 35, or may further include a switching layer and a third electrode layer which are provided on the second electrode layer 36. A mask pattern 37 is then formed on the stack ST.

In an embodiment, after FIG. 5D the process proceeds as described with respect to FIGS. 4C through 4H.

In another embodiment (in which none of the second plugs 32B are surface-treated), after FIG. 5D the process proceeds as described with respect to FIGS. 4C, 4D, 4G, and 4H, except that all of contact holes H1 and H2 are formed at FIG. 4D.

Figure 6:
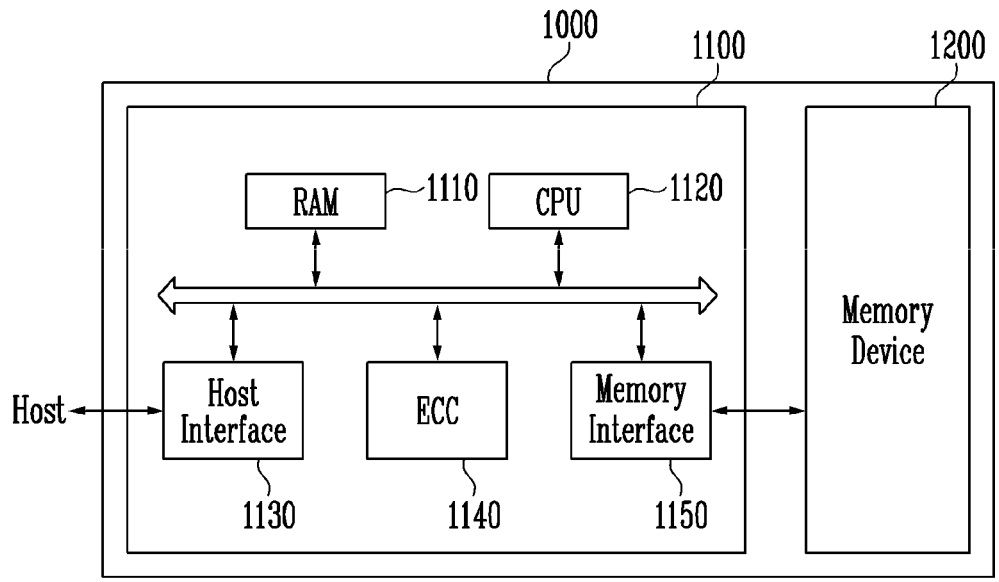
FIGS. 6 and 7 illustrate respective memory systems in accordance with embodiments.

FIG. 6 is a block diagram illustrating the configuration of a memory system 1000 in accordance with an embodiment of the present disclosure. The memory system 1000 may include a memory device 1200 and a controller 1100.

The memory device 1200 may be used to store data information. The memory device 1200 may be a nonvolatile memory. The memory device 1200 may have the structure described with reference to FIGS. 1A to 5D, and be fabricated using the fabrication process described with reference to FIGS. 1A to 5D. In an embodiment, the memory device 1200 may include: row lines extending in a first direction; column lines extending in a second direction intersecting with the first direction; memory cells disposed at intersections between the row lines and the column lines; row contact plugs coupled to the respective row lines; and column contact plugs coupled to the respective column lines. Each of the memory cells may have a current path extending from a row contact plug to a column contact plug. A column contact plug that is coupled to a relatively short current path may have a higher resistance compared to that of a column contact plug that is coupled to a relatively long current path.

The controller 1100 may be coupled to a host and the memory device 1200, and may access the memory device 1200 in response to a request from the host. For example, the controller 1100 may control read, write, erase, and background operations of the memory device 1200.

The controller 1100 may include a random access memory (RAM) 1110, a central processing unit (CPU) 1120, a host interface 1130, an error correction code (ECC) circuit 1140, a memory interface 1150, and so on.

The RAM 1110 may be used as an operation memory of the CPU 1120, a cache memory between the memory device 1200 and the host, a buffer memory between the memory device 1200 and the host, or the like, and may be a static random access memory (SRAM), a dynamic random access memory (DRAM), or the like.

The CPU 1120 may control the overall operation of the controller 1100. For example, the CPU 1120 may operate firmware such as a flash translation layer (FTL) stored in the RAM 1110.

The host interface 1130 may interface with the host and may communicate with the host through at least one interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, and the like.

The ECC circuit 1140 may use an error correction code (ECC) to detect and correct errors in data read from the memory device 1200. The memory interface 1150 may interface with the memory device 1200.

Since the memory system 1000 according to the embodiment includes the memory device 1200 having improved integration and characteristics, the integration and characteristics of the memory system 1000 may also be improved.

Figure 7:
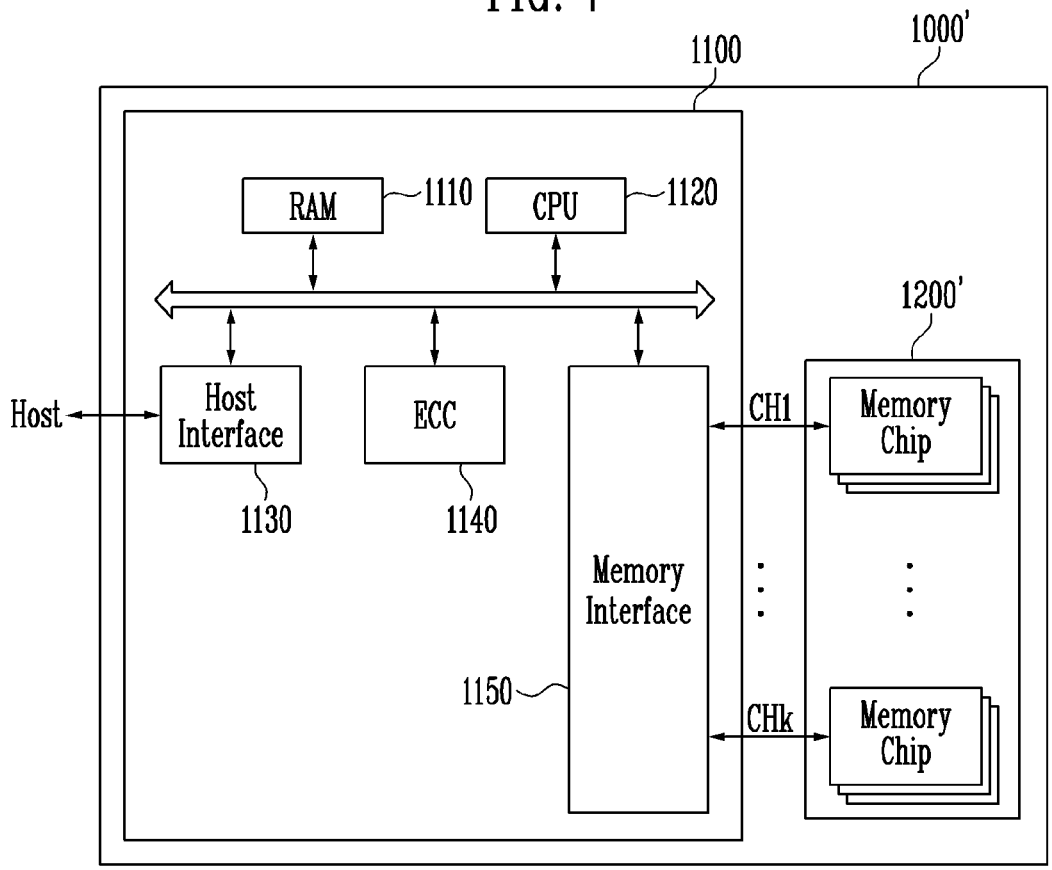

FIG. 7 is a block diagram illustrating the configuration of a memory system 1000' in accordance with an embodiment of the present disclosure. Repetitive explanation will be omitted.

The memory system 1000' may include a memory device 1200' and a controller 1100. The controller 1100 includes a RAM 1110, a CPU 120, a host interface 1130, an ECC circuit 1140, a memory interface 1150, and so on, such as described with respect to FIG. 6.

The memory device 1200' may be a nonvolatile memory. The memory device 1200' may have the structure described with reference to FIGS. 1A to 5D, and be fabricated by the fabricating process described with reference to FIGS. 1A to 5D. In an embodiment, the memory device 1200' may include: row lines extending in a first direction; column lines extending in a second direction intersecting with the first direction; memory cells disposed at intersections between the row lines and the column lines; first contact plugs coupled to the respective row lines; and second contact plugs coupled to the respective column lines. Each of the memory cells may have a current path extending from a first contact plug to a second contact plug via a memory cell. Among the second contact plugs, a second contact plug that has a relatively short current path has a higher resistance compared to that of a second contact plug that has a relatively long current path. The structure of the memory device 1200' and the fabricating process thereof are the same as those described above; therefore detailed explanation thereof will be omitted.

Furthermore, the memory device 1200' may be a multi-chip package including a plurality of memory chips. The plurality of memory chips may be divided into a plurality of groups. The plurality of groups may communicate with the controller 1100 through first to k-th channels CH1 to CHk. The memory chips of each group may communicate with the controller 1100 through a common channel, or through respective individual channels.

Because the memory system 1000' according to the embodiment includes the memory device 1200' having improved integration and characteristics, the integration and characteristics of the memory system 1000' may also be improved. In particular, the memory device 1200' according to the present embodiment may be formed of a multi-chip package, whereby the data storage capacity and the operating speed thereof may be enhanced.

Figure 8:
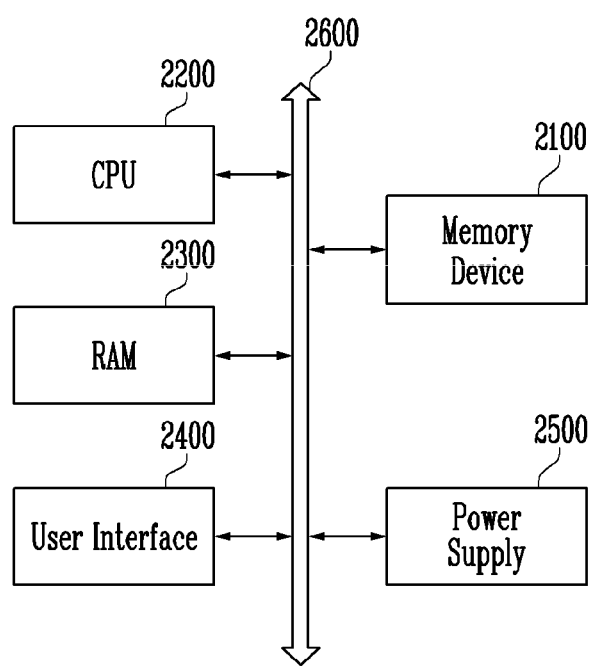
FIG. 8 illustrates a computing system in accordance with an embodiment.

FIG. 8 is a block diagram illustrating the configuration of a computing system 2000 in accordance with an embodiment of the present disclosure.

The computing system 2000 may include a memory device 2100, a CPU 2200, a RAM 2300, a user interface 2400, a power supply 2500, a system bus 2600, and so forth.

The memory device 2100 may store data provided via the user interface 2400, data processed by the CPU 2200, etc. Furthermore, the memory device 2100 may be electrically coupled to the CPU 2200, the RAM 2300, the user interface 2400, the power supply 2500, etc. by the system bus 2600. For example, the memory device 2100 may be coupled to the system bus 2600 via a controller (not shown) or may be directly coupled to the system bus 2600. When the memory device 2100 is directly coupled to the system bus 2600, the function of the controller may be performed by the CPU 2200, the RAM 2300, etc.

The memory device 2100 may be a nonvolatile memory. The memory device 2100 may include one or more of the memory device 1200 of FIG. 6, one or more of the memory device 1200' of FIG. 7, or both.

The computing system 2000 having the above-mentioned configuration may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or the like.

As described above, since the computing system 2000 according to the embodiment includes the memory device 2100 having improved integration and characteristics, the characteristics of the computing system 2000 may also be improved.

In an process 1A, a method for fabricating a semiconductor device includes forming a plurality of conductive plugs including first and second conductive plugs, the first conductive plug being associated with a first current path of a first memory cell and the second conductive plug being associated with a second current path of a second memory cell, and processing the first conductive plug to increase a resistance of the first conductive plug to a value higher than a resistance of the second conductive plug.

In an embodiment 1B of process 1A, the plurality of conductive plugs includes a plurality of row plugs and a plurality of column plugs, and the method further comprises forming a plurality of row lines extending across a memory cell array area in a first direction and respectively coupled to the plurality of row plugs, forming a plurality of column lines extending across the memory cell array area in a second direction and respectively coupled to the plurality of column plugs, forming a plurality of memory cells at intersections of the plurality of row lines and the plurality of column lines, each memory cell having a current path including a portion of a row line coupled to the memory cell and a portion of a column line coupled to the memory cell, wherein the plurality of memory cells includes the first and second memory cells, wherein the first and second conductive plugs are respectively coupled to the first and second current paths, and wherein the first current path is longer than the second current path, a resistance of the first current path is higher than a resistance of the second current path, or both.

In an embodiment of process 1B, the plurality of row plugs are disposed along a first side of the memory cell array area, the plurality of column plugs are disposed along a second side of the memory cell array area, and the second side is orthogonal to the first side, and the first contact plug and the second contact plug are disposed along a same side of the memory cell array area.

In another embodiment of process 1B, when the first conductive plug and the second conductive plug are row plugs disposed along the first side, a distance from the first conductive plug to the second side is less than a distance from the second conductive plug to the second side, and when the first conductive plug and the second conductive plug are column plugs disposed along the second side, a distance from the first conductive plug to the first side is less than a distance from the second conductive plug to the first side.

In an embodiment 1C of process 1A, processing the first conductive plug includes patterning a masking layer over the plurality of conductive plugs to expose the first conductive plug while masking the second conductive plug, the first conductive plug being exposed by a first hole through the masking layer; and performing surface treatment of the first conductive plug through the first hole. In an embodiment 1D embodiment of process 1C includes forming an insulating layer over the plurality of conductive plugs, patterning the masking layer over the insulating layer, forming, through the first hole, a second hole through the insulating layer, and performing the surface treatment of the first conductive plug through the first hole and the second hole.

An embodiment of process 1D further includes removing the masking layer after forming the second hole, wherein performing the surface treatment comprises increasing a flow rate of oxygen gas used when removing the masking layer.

Another embodiment of process 1D further includes, after performing the surface treatment, forming an upper conductive plug in the second hole and electrically coupled to the first conductive plug.

In another embodiment of process 1C, performing the surface treatment comprises forming an oxide pattern on a top surface of the first conductive plug.

In another embodiment of process 1C, performing the surface treatment comprises increasing an oxygen concentration of a portion of the first conductive plug.

In an electronic device and a method of fabricating the electronic device in accordance with embodiments of the present disclosure, operating characteristics and reliability of memory cells may be improved by preventing over currents from damaging the memory cells.

Examples of embodiments have been disclosed herein, and although specific terms are used, they are not intended to be limiting. In some instances, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes may be made without departing from the scope of the present disclosure as set forth in the following claims.

What is claimed is:

1. An electronic device including a semiconductor memory, the semiconductor memory comprising:
   a first memory cell having a first current path coupled to a first contact plug, the first current path having a first resistance; and
   a second memory cell having a second current path coupled to a second contact plug, the second current path having a second resistance, the second resistance being higher than the first resistance,
   wherein a resistance of the first contact plug is higher than a resistance of the second contact plug to compensate for a difference between the first and second resistances.

2. The electronic device of claim 1, further comprising:
   a plurality of conductive lines including row lines and column lines;
   a plurality of contact plugs including row contact plugs and column contact plugs, the row contact plugs respectively coupled to the row lines, the column contact plugs respectively coupled to the column lines; and
   a plurality of memory cells provided in a cell region and including the first and second memory cells, each memory cell having a current path coupled to a row contact plug and a column contact plug, the current path including a portion of a column line coupled between the memory cell and the column contact plug and a portion of a row line coupled between the memory cell and the row contact plug.

3. The electronic device of claim 2, further comprising:
   third and fourth contact plugs disposed in a periphery of the cell region,
   wherein the first current path includes a portion of a first conductive line coupled between the first memory cell and the third contact plug,
   wherein the second current path includes a portion of a second conductive line coupled between the second memory cell and the fourth contact plug, and
   wherein the portion of the first conductive line is shorter than and has a lower resistance than the portion of the second conductive line.

4. The electronic device of claim 3, wherein the cell region comprises a first area adjacent to the first and second contact plugs and a second area adjacent to the first area,
   wherein the first conductive line is disposed in the first area and not disposed in the second area, and
   wherein the second conductive line is disposed in the second area.

5. The electronic device of claim 3, wherein the cell region comprises:

a first area adjacent to a first side of the cell region, the first side being adjacent to the first and second contact plugs, and a second area adjacent to a second side of the cell region, the second side being opposite the first side;

wherein the first conductive line is disposed in the first area and not disposed in the second area, and wherein the second conductive line is disposed in the second area.

6. The electronic device of claim 1, wherein the first contact plug includes a region having an oxygen concentration higher than that of a corresponding region of the second contact plug to increase the resistance of the first contact plug.

7. The electronic device of claim 1, wherein the first contact plug includes an oxide pattern disposed on a surface of the first contact plug to increase the resistance of the first contact plug.

8. The electronic device of claim 7, wherein the first contact plug includes a first conductive portion and a second conductive portion disposed over the first conductive portion, and the oxide pattern is disposed over a surface of the first conductive portion.

9. The electronic device of claim 1, further comprising:
a plurality of conductive lines including row lines and column lines;

a plurality of contact plugs including row contact plugs and column contact plugs, the row contact plugs respectively coupled to the row lines, the column contact plugs respectively coupled to the column lines; and a plurality of memory cells provided in a cell region and including the first and second memory cells, each memory cell having a current path coupled to a row contact plug and a column contact plug, the current path including a portion of a column line coupled between the memory cell and the column contact plug and a portion of a row line coupled between the memory cell and the row contact plug, wherein the first contact plug and the second contact plug are each disposed along a first side of the semiconductor memory, wherein at least one contact plug is disposed along a second side of the semiconductor memory, the second side being orthogonal to the first side, wherein the first contact plug is closer to the second side than the second contact plug, wherein contact plugs disposed along the first side are grouped into a plurality of groups of contact plugs according to respective distances between the contact plugs and the second side, wherein a first group of the plurality of groups includes contact plugs having a distance to the second side that is less than a first predetermined value, wherein a second group of the plurality of groups includes contact plugs having a distance to the second side that is greater than a second predetermined value, the second predetermined value being greater than or equal to the first predetermined value, wherein the first contact plug is in the first group, wherein the second contact plug is in the second group, and wherein each contact plug in the first group has substantially the same resistance as that of the first contact plug.

10. The electronic device of claim 9, wherein a third group of the plurality of groups includes contact plugs having a distance to the second side that is greater than the first predetermined value and less than the second predetermined value, and wherein each contact plug in the third group has a respective resistance that is less than the resistance of the first contact plug and greater than the resistance of the second contact plug.

11. An electronic device including a semiconductor memory, the semiconductor memory comprising:
a plurality of conductive lines including row lines and column lines;

a plurality of contact plugs including row contact plugs and column contact plugs, the row contact plugs respectively coupled to the row lines, the column contact plugs respectively coupled to the column lines; and a plurality of memory cells provided in a cell region, each memory cell having a current path coupled to a row contact plug and a column contact plug, the current path including a portion of a column line coupled between the memory cell and the column contact plug and a portion of a row line coupled between the memory cell and the row contact plug, wherein a first memory cell has a first current path coupled to a first contact plug, the first current path having a first resistance, wherein a second memory cell has a second current path coupled to a second contact plug, the second current path having a second resistance, the second resistance being higher than the first resistance, and wherein the first contact plug is configured to have a higher resistance than that of the second contact plug to compensate for a difference between the first and second resistances.

12. The electronic device of claim 11, wherein the plurality of contact plugs is disposed in a periphery of the cell region and include a third contact plug and a fourth contact plug, wherein the first current path including a portion of a first conductive line coupled between the first memory cell and the third contact plug, wherein the second current path including a portion of a second conductive line coupled between the second memory cell and the fourth contact plug, and wherein the portion of the first conductive line is shorter than and has a lower resistance than the portion of the second conductive line.

13. The electronic device of claim 12, wherein the cell region comprises a first area adjacent to the first and second contact plugs and a second area adjacent to the first area, wherein the first conductive line is disposed in the first area and not disposed in the second area, and wherein the second conductive line is disposed in the second area.

14. The electronic device of claim 12, wherein the cell region comprises:
a first area adjacent to a first side of the cell region, the first side being adjacent to the first and second contact plugs, and a second area adjacent to a second side of the cell region, the second side being opposite the first side;

wherein the first conductive line is disposed in the first area and not disposed in the second area, and wherein the second conductive line is disposed in the second area.

15. The electronic device of claim 11, wherein the first contact plug includes a region having an oxygen concentration higher than oxygen concentration of a corresponding region of the second contact plug to increase the resistance of the first contact plug.

16. The electronic device of claim 11, wherein the first contact plug includes an oxide pattern disposed on a surface of the first contact plug to increase the resistance of the first contact plug.

17. The electronic device of claim 16, wherein the first contact plug includes a first conductive portion and a second conductive portion disposed on top of the first conductive portion, and the oxide pattern is disposed on a top surface of the first conductive portion.

18. The electronic device of claim 11, wherein the first contact plug and the second contact plug are each disposed along a first side of the semiconductor memory.

19. The electronic device of claim 18, wherein at least one contact plug is disposed along a second side of the semiconductor memory, the second side being orthogonal to the first side,
   wherein the first contact plug is closer to the second side than the second contact plug,
   wherein contact plugs disposed along the first side are grouped into a plurality of groups of contact plugs according to respective distances between the contact plugs and the second side,
   wherein a first group of the plurality of groups includes contact plugs having a distance to the second side that is less than a first predetermined value,
   wherein a second group of the plurality of groups includes contact plugs having a distance to the second side that is greater than a second predetermined value, the second predetermined value being greater than or equal to the first predetermined value,
   wherein the first contact plug is in the first group,
   wherein the second contact plug is in the second group, and
   wherein each contact plug in the first group has substantially the same resistance as that of the first contact plug.

20. The electronic device of claim 19, wherein a third group of the plurality of groups includes contact plugs having a distance to the second side that is greater than the first predetermined value and less than the second predetermined value, and
   wherein each contact plug in the third group has a respective resistance that is less than the resistance of the first contact plug and greater than the resistance of the second contact plug.

* * * * *

UNITED STATES PATENT AND TRADEMARK OFFICE
CERTIFICATE OF CORRECTION

PATENT NO. : 10,741,491 B1
APPLICATION NO. : 16/538690
DATED : August 11, 2020
INVENTOR(S) : Han Woo Cho It is certified that error appears in the above-identified patent and that said Letters Patent is hereby corrected as shown below:

In the Drawings

Sheet 12, FIG. 5B, reference numeral 37B should be replaced with --39B--; FIG. 5C, reference numeral 37B should be replaced with --39B--.

In the Specification

Column 2, Line 38, "FIGS. 1B and 1C" should read --FIGS. 1A and 1B--.

Column 3, Line 45, "devices" should read --elements--.

Column 4, Line 41, "BCT2" should read --BCT3--.

Column 5, Lines 20-22, Equation 1 should appear as follows:

$$RPij = RWCTi + RBCTj + \sum_{x=1}^{j} RWi,x + \sum_{y=1}^{i} RBy,j + RCi,j$$

Column 5, Lines 26-29, should read:
--RBCTj is a resistance of column contact plug BCTj, RWi,x is a resistance of a $x^{th}$ portion of the $i^{th}$ row line WLi, RBy,j is a resistance of an $y^{th}$ portion of the $j^{th}$ column line BLj, and RCi,j is a resistance of memory cell MCij.--.

Column 10, Line 38, "BCT" should read --WCT--; Line 45, "BCT" should read --WCT--.

Column 11, Line 26, "direction II" should read --direction I--.

Column 12, Line 53, "3B" should read --3C--; Line 57, "RG2N, RG2M" should read --RG1N, RG1M--; Line 58, "RG2F" should read --RG1F--.

Signed and Sealed this
Twentieth Day of October, 2020

Andrei Iancu
*Director of the United States Patent and Trademark Office*

CERTIFICATE OF CORRECTION (continued)
U.S. Pat. No. 10,741,491 B1

Column 13, Line 22, "map" should read --mat--; Line 24, "map" should read --mat--.

Column 15, Line 35, "third" should read --second--; Line 59, "view B" should read --view C--.

Column 16, Line 2, "21" should read --31--; Line 7, "39" should read --39B--; Line 15, "second plug" should read --first plug 32A--; Line 16, "including" should read --includes--; Line 17, "formed" should read --are formed--; Line 19, "first contact holes H1" should read --additional contact holes--.

Column 17, Line 45, "120" should read --1120--.